(12) United States Patent
Posseme et al.

(10) Patent No.: US 11,941,485 B2
(45) Date of Patent: Mar. 26, 2024

(54) METHOD OF MAKING A QUANTUM DEVICE

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Louis Hutin, Grenoble (FR); Cyrille Le Royer, Grenoble (FR); François Lefloch, Grenoble (FR); Fabrice Nemouchi, Grenoble (FR); Maud Vinet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 90 days.

(21) Appl. No.: 17/456,388

(22) Filed: Nov. 24, 2021

(65) Prior Publication Data
US 2022/0172093 A1 Jun. 2, 2022

(30) Foreign Application Priority Data
Nov. 27, 2020 (FR) ..................... 20 12305

(51) Int. Cl.
*H01L 21/32* (2006.01)
*G06N 10/00* (2022.01)
(Continued)

(52) U.S. Cl.
CPC ....... *G06N 10/00* (2019.01); *H01L 29/66977* (2013.01); *H10N 60/01* (2023.02); *H10N 60/128* (2023.02)

(58) Field of Classification Search
CPC ........... H01L 29/66977; H01L 21/3205; H01L 21/7689; H03K 17/92
See application file for complete search history.

(56) References Cited

U.S. PATENT DOCUMENTS 5,621,223 A * 4/1997 Nakamura ........... H10N 60/124
257/38
10,607,993 B2 3/2020 Hutin et al.
(Continued)

FOREIGN PATENT DOCUMENTS

EP 3 401 848 A1 11/2018
EP 3 473 592 A1 4/2019
(Continued)

OTHER PUBLICATIONS

French Preliminary Search Report dated Sep. 30, 2021 in French Application 20 12305 filed on Nov. 27, 2020, 9 pages (with English Translation of Categories of Cited Documents & Written Opinion).
(Continued)

*Primary Examiner* — Vu A Vu
*Assistant Examiner* — Valerie N Newton
(74) *Attorney, Agent, or Firm* — Oblon, McClelland, Maier & Neustadt, L.L.P.

(57) ABSTRACT

A method for producing a quantum device comprising providing a substrate having a front face and carrying at least one transistor pattern on the front face thereof, said transistor pattern comprising, in a stack a gate dielectric on the front face of the substrate, and a gate on the gate dielectric, said gate having a top and sidewalls. The method further includes forming a protective layer at the front face of the substrate, said protective layer being configured to prevent diffusion of at least one metal species in the substrate, forming a metal layer that has, as a main component, at least one metal species, at least on the sidewalls of the gate, said at least one metal species comprising at least one superconducting element, and forming a superconducting region in the gate by lateral diffusion of the at least one superconducting element from the sidewalls of said gate.

15 Claims, 18 Drawing Sheets

(51) Int. Cl.
   *H01L 21/76*   (2006.01)
   *H01L 29/66*   (2006.01)
   *H10N 60/01*   (2023.01)
   *H10N 60/10*   (2023.01)

(56) References Cited

U.S. PATENT DOCUMENTS

| | | |
|---|---|---|
| 2019/0123183 A1 | 4/2019 | Hutin et al. |
| 2019/0266509 A1 | 8/2019 | Hutin et al. |
| 2020/0161422 A1 | 5/2020 | Nemouchi et al. |
| 2020/0279937 A1 | 9/2020 | Pillarisetty et al. |
| 2022/0173229 A1* | 6/2022 | Posseme ............... H01L 39/228 |

FOREIGN PATENT DOCUMENTS

| | | |
|---|---|---|
| FR | 3 068 518 A1 | 1/2019 |
| FR | 3 088 483 A1 | 5/2020 |
| WO | WO 2019/002761 A1 | 1/2019 |

OTHER PUBLICATIONS

De Franceschi et al., "SOI technology for quantum information processing", 2016 IEEE International Electron Devices Meeting (IEDM), 2016, 4 pages.

Hutin et al., "Gate reflectometry for probing charge and spin states in linear Si MOS split-gate arrays", 2019 IEEE International Electron Devices Meeting (IEDM), 2019, 4 pages.

Maurand et al., "A CMOS silicon spin qubit", Nature Communications, 2016, 6 pages.

Vinet et al., "Towards scalable silicon quantum computing", 2018 IEEE International Electron Devices Meeting (IEDM), 2018, 4 pages.

* cited by examiner

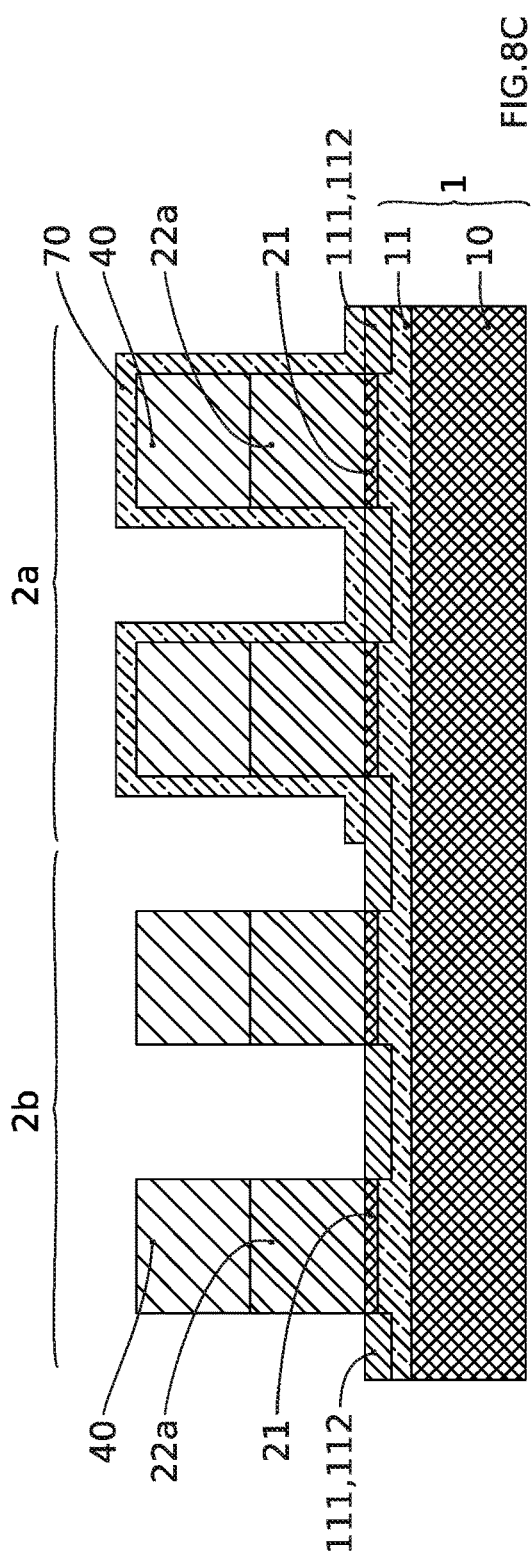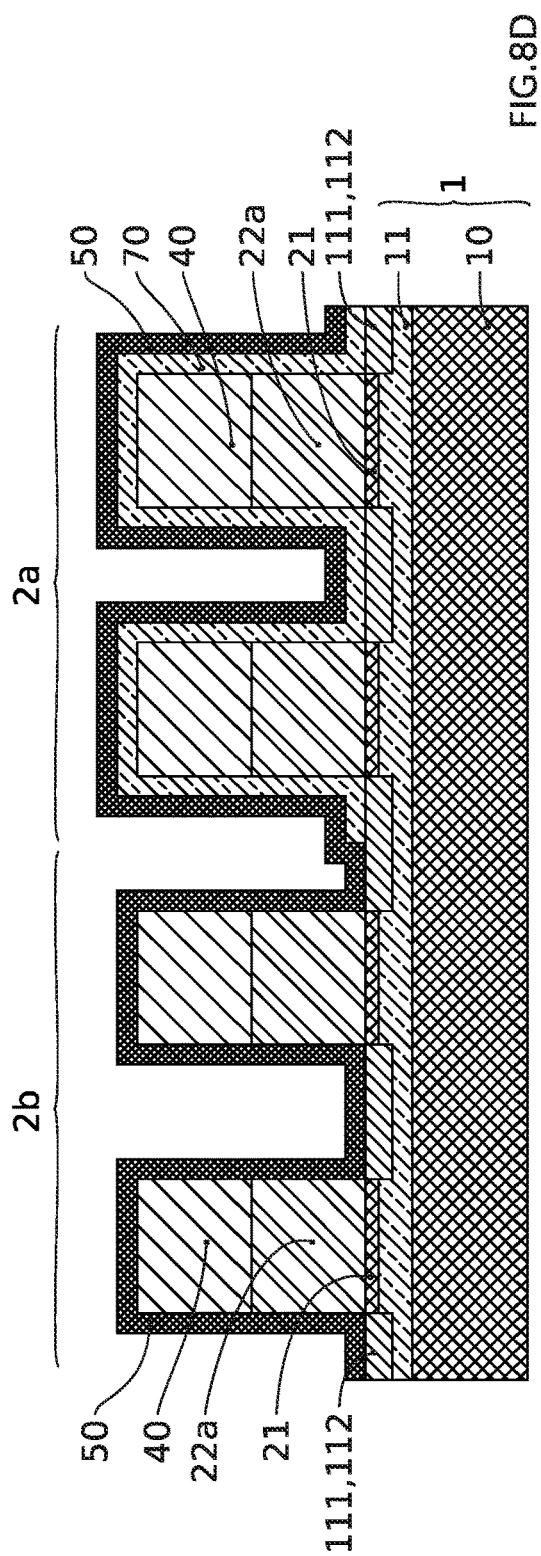

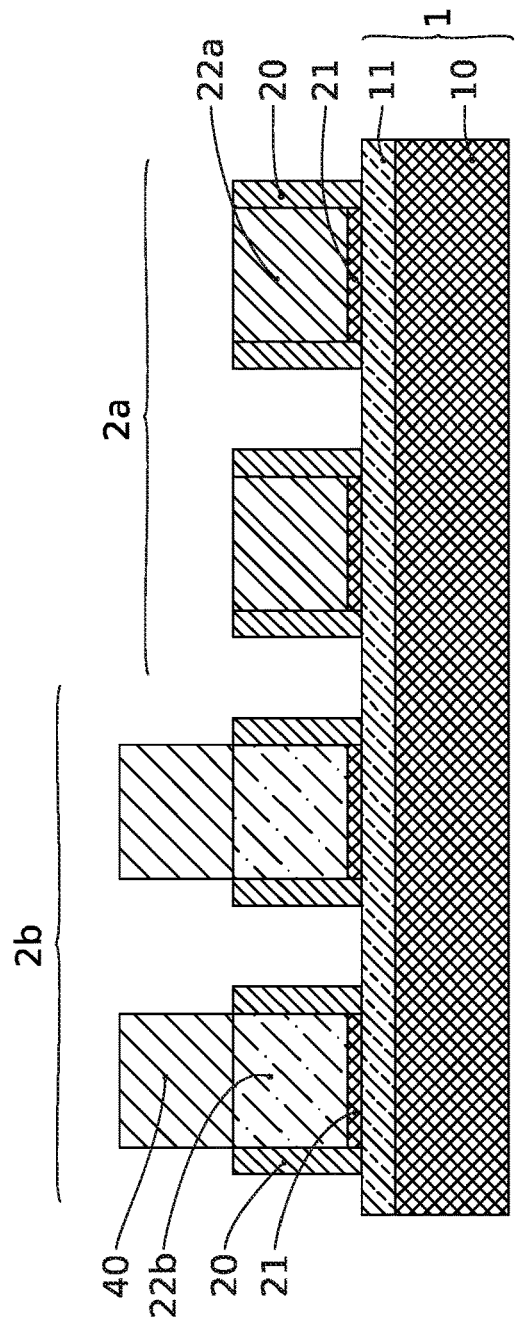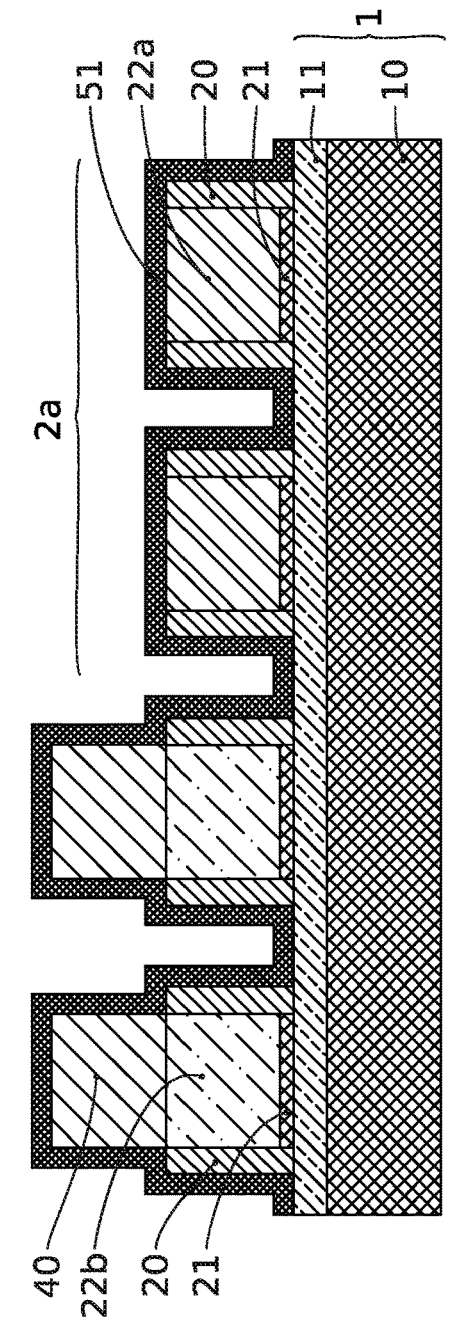

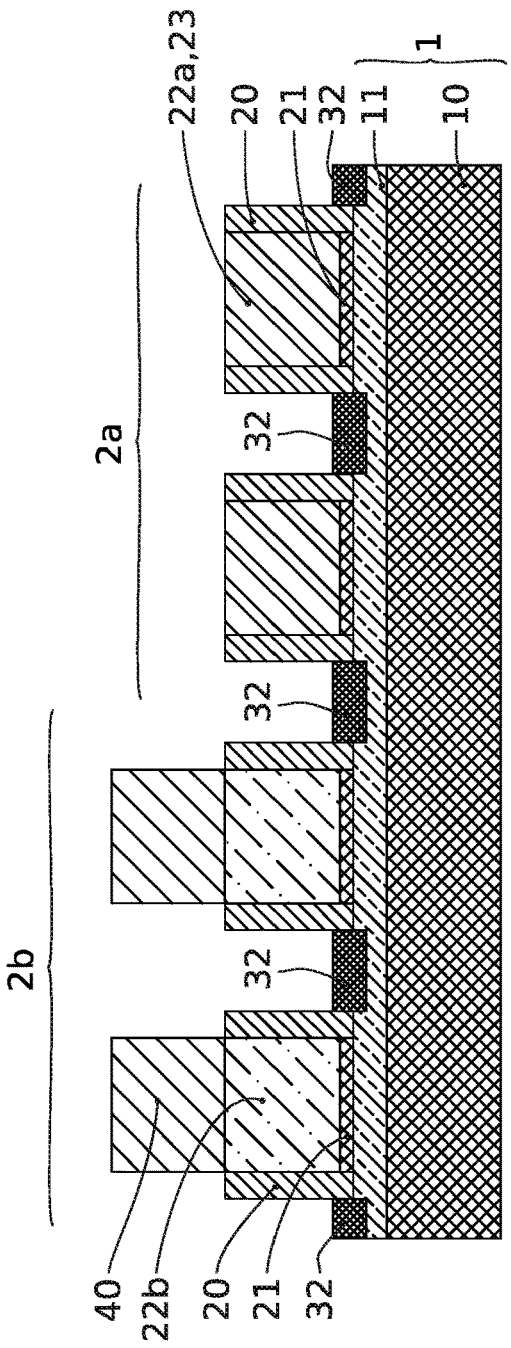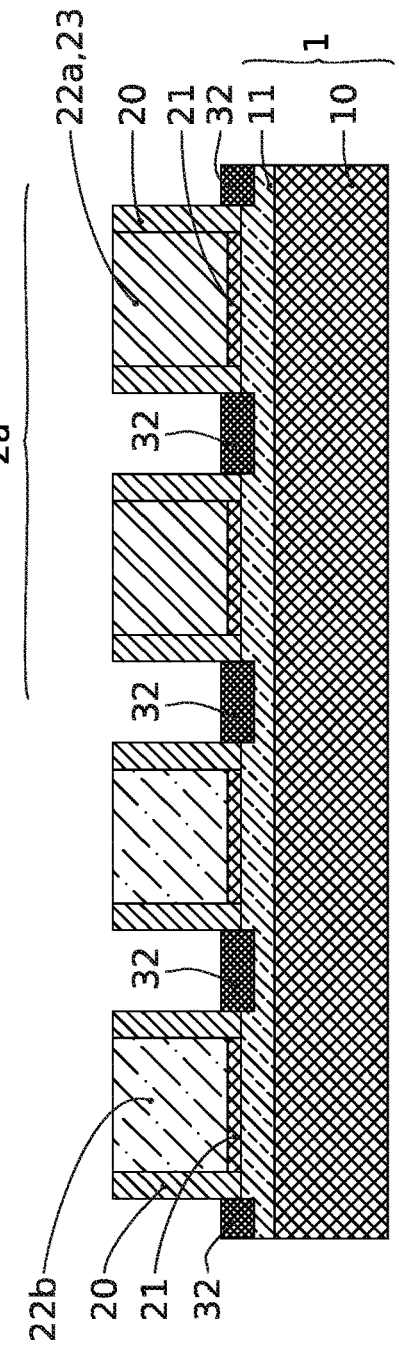

METHOD OF MAKING A QUANTUM DEVICE

TECHNICAL FIELD

The present invention relates to the field of quantum electronics. One particularly advantageous application is that of the production of superconducting gates in quantum bit devices (referred to as qubits), in particular for devices based on spin qubit or superconducting qubit architectures.

PRIOR ART

In the field of quantum electronics, a quantum bit or qubit is a quantum state that represents the smallest unit of quantum information storage. This quantum state is characterised by the quantum superposition of a plurality of states, in particular the state 0 and the state 1. In practice, the quantum bit can be obtained by different devices based on different architectures. There are thus qubits linked to a quantum state:
- of a charge carrier, for example the spin of an electron or of a hole (spin qubit),
- of a current flowing in a superconductor, for example its phase (superconducting qubit),
- of a trapped ion or of an atom or a molecule, for example its energy level,
- of a photon, for example its polarisation (photon qubit).

Each type of device has its own intrinsic advantages and drawbacks. For example, quantum devices with superconducting qubits allow good entanglement between qubits. However, these devices are still subject to too much variability. They are in particular sensitive to small imperfections resulting from the manufacturing methods. They in particular require a very high quality interface between the two superconducting reservoirs to achieve a Josephson effect. It is also difficult to form a unitary qubit using these devices.

Spin qubit quantum devices can operate with a smaller number of qubits, and consume less energy. They can also benefit from microelectronic manufacturing methods and technologies to improve reproducibility and increase the integration density of these spin qubit devices.

The document entitled "SOI technology for quantum information processing" by S. De Franceschi et al, Electron Devices Meeting (IEDM), 2016 IEEE International, pp. 13.4.1-13.4.4, describes a spin-qubit quantum device produced using a manufacturing method derived from fully depleted channel transistor (FDSOI) technologies. FIG. 1 shows some standard steps in the manufacture of such a device. One or more transistor patterns, each comprising a gate and a gate dielectric are formed 100 on an SOI substrate. Spacers are then formed 200 on either side of the gate patterns. The raised source/drain regions are formed 300 by epitaxy at the edge of and around the outer spacers. After removal 400 of the hard mask from the top of the gate, the gate is silicided 500. This method in particular allows for the production of a quantum device with two qubits in series, in an active region 11 of an SOI substrate 1, as shown in FIG. 2. The two gates 22a are used to control these two qubits. The source and drain regions 31 form charge carrier reservoirs for these two qubits. Nonetheless, such a spin qubit quantum device has a lower operating speed than a superconducting qubit device. These limitations are due in part to the method for producing this device.

One purpose of the present invention is to overcome, at least in part, some of the aforementioned drawbacks.

In particular, the present invention aims to provide a method for producing a quantum device that reduces energy consumption while improving operating speed.

Other purposes, features and advantages of the present invention will appear upon reading the following description and the accompanying drawings. It is understood that other advantages can be incorporated therein.

SUMMARY

To achieve this objective, a first aspect of the invention relates to a method for producing a quantum device comprising the following steps of:
  Providing a substrate having a front face and carrying at least one transistor pattern on the front face thereof,
  Said transistor pattern comprising, in a stack:
    a gate dielectric on the front face of the substrate,
    a gate on the gate dielectric, said gate having a top and sidewalls,
  Forming a protective layer at the front face of the substrate, said protective layer being configured to prevent diffusion (or reaction) of at least one metal species in the substrate,
  Forming a metal layer based on at least one metal species at least on the sidewalls of the gate,
  Forming a superconducting region in the gate by lateral diffusion of the at least one metal species from the sidewalls of said gate.

Thus, an electron spin qubit quantum device can in particular be produced. More specifically, such a device requires magnetic field modulation. The superconducting region formed in the gate of the transistor pattern advantageously allows a magnetic field compatible with the control of electron spin qubits to be generated and modulated.

Existing methods generally implement a step of siliciding the gate from the top. This is not appropriate for spin control. During the development of the present invention, it became apparent that good spin control required the formation of a superconducting region as close as possible to the channel, immediately above the gate dielectric. In contrast to prior art methods, the method according to the invention allows such a superconducting region to be formed by lateral diffusion from the sidewalls of the gate.

This lateral diffusion is carried out from the metal layer. This metal layer comprises at least one metal species capable of forming a superconducting compound or alloy by reaction after diffusion within the gate. In such a case, the diffusion is referred to as reactive diffusion. According to one possibility, the metal species is superconducting prior to the reaction and simply diffuses within the gate.

In order to prevent the diffusion of the at least one metal species in the substrate, a protective layer is advantageously formed at the front face of the substrate.

The protective layer can thus prevent the diffusion of metal species from a metal layer at the surface of the substrate, for example deposited by conformal deposition. The protective layer can further prevent surface diffusion or reaction of the substrate with metal species originating from metal residues formed as a result of lateral diffusion from the sidewalls of the gate.

The method according to the invention thus enables a quantum device with a superconducting gate transistor architecture to be produced.

This enables an electron spin qubit quantum device to be produced with an enhanced operating speed. The superconducting region formed by the method according to the invention also reduces the energy consumption of the device during qubit operations.

A superconducting qubit quantum device can also be produced using the method according to the invention. Such a device thus benefits from the advantages of implementing the method using technology of the microelectronics industry. In particular, the integration density of such a device can be increased.

According to a separable aspect, the invention further relates to a quantum device having a superconducting gate transistor architecture as obtained by the method according to the invention.

BRIEF DESCRIPTION OF THE FIGURES

The aims, purposes, features and advantages of the invention will be better understood upon reading the detailed description of embodiments thereof, which are shown by means of the following accompanying drawings, in which:

FIG. 8A to 8F diagrammatically show the steps involved in forming co-integrated quantum devices and transistors, according to one embodiment of the method according to the present invention.

FIG. 9A to 9D diagrammatically show the steps involved in forming co-integrated quantum devices and transistors according to another embodiment of the method according to the present invention.

Figure 1:
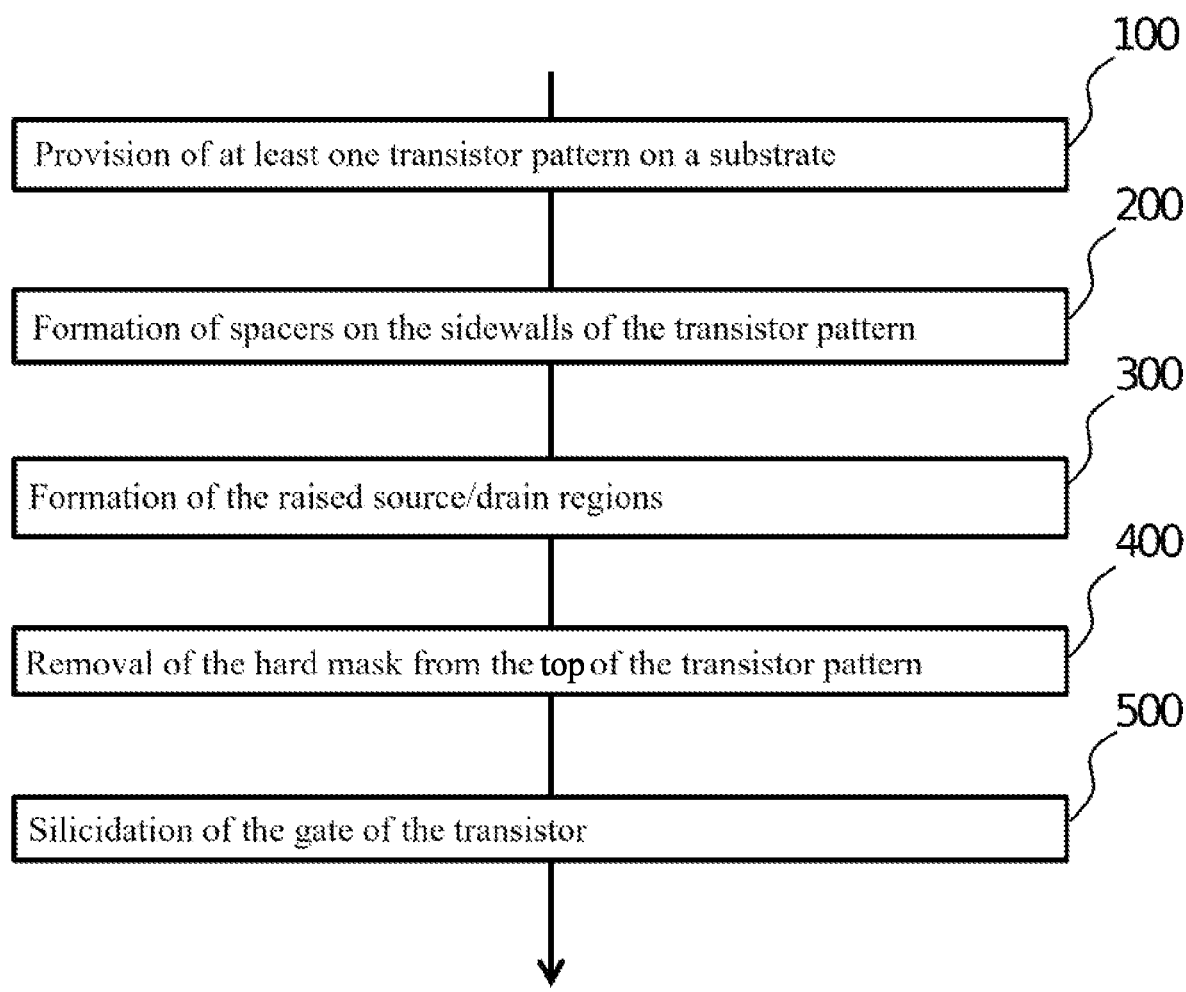
FIG. 1 shows a diagram illustrating the steps involved in producing a transistor according to a method of the prior art.
Figure 2:
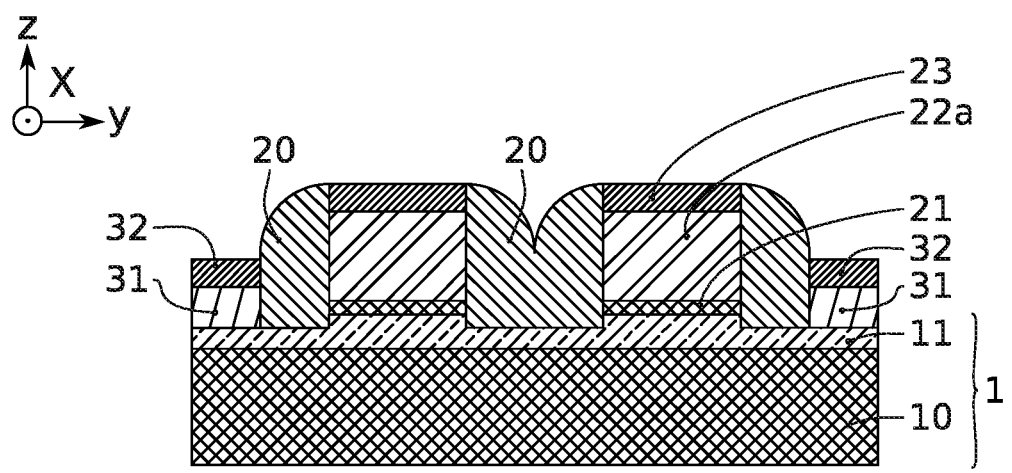
FIG. 2 diagrammatically shows a quantum device according to the prior art obtained from the production method shown in FIG. 1.
Figure 3:
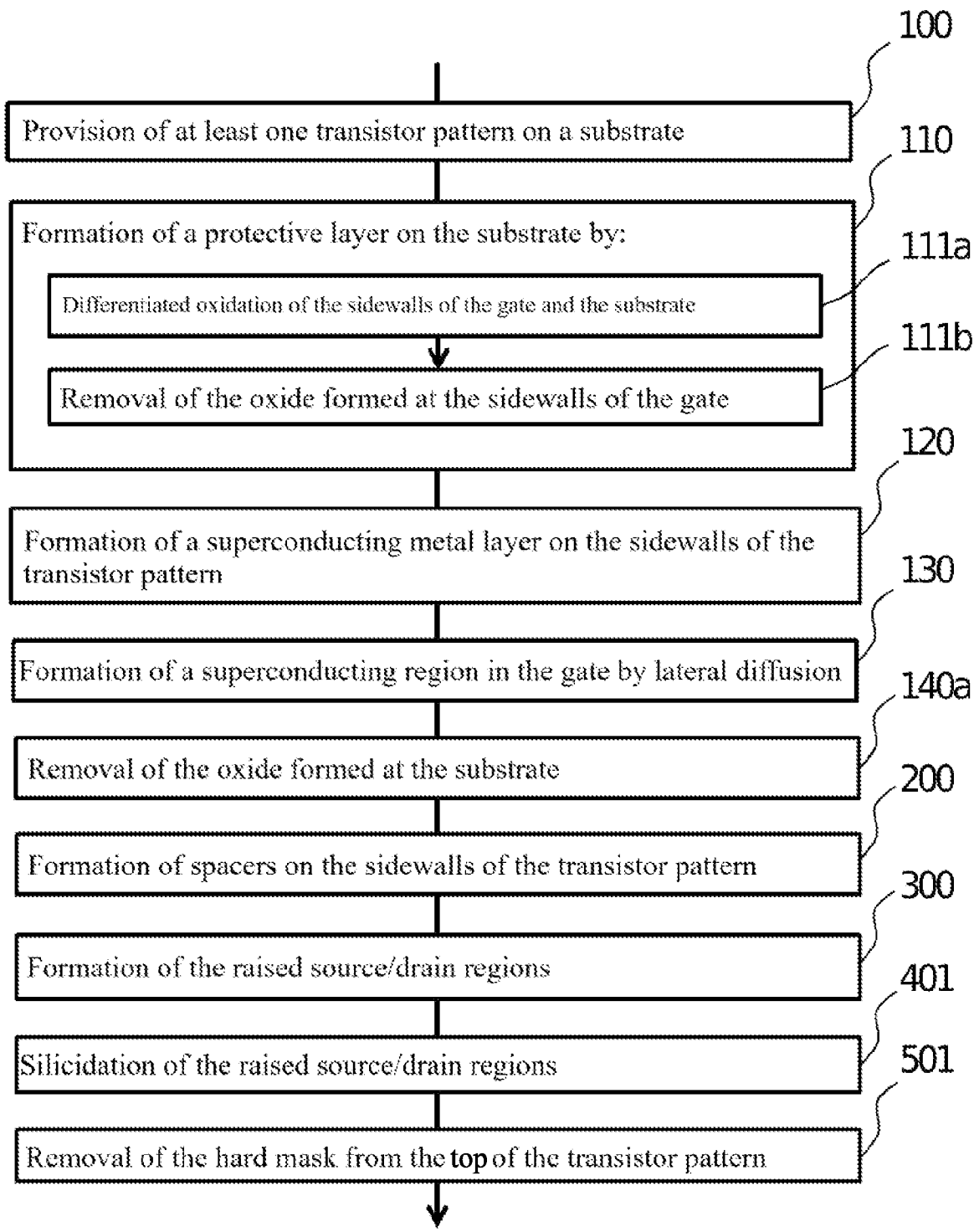
FIG. 3 shows a diagram illustrating the steps involved in producing a quantum device according to a first embodiment of the method according to the present invention.

The drawings are provided by way of example and are not intended to limit the scope of the invention. They constitute diagrammatic views intended to ease the understanding of the invention and are not necessarily to the scale of practical applications. In particular, the relative dimensions of the different layers, portions and elements of the device (for example the spacer, the active layer, the protective layer, the source/drain region, the gate, or the hard mask) are not representative of reality.

DETAILED DESCRIPTION

Before giving a detailed review of embodiments of the invention, optional features are set out below, which can be used in combination with or in replacement of one another.

According to one example, the transistor pattern provided further comprises a hard mask on the top of the gate, said hard mask being configured to prevent diffusion of at least one metal species in the gate from said top, such that the formation of the superconducting region only occurs by lateral diffusion from the sidewalls of the gate. This results in a relatively planar diffusion front progressing from each of the sidewalls to a median plane in the centre of the gate. This improves the quality of the superconducting region thus formed.

According to one example, the metal layer formed comprises at least one metal species chosen from cobalt, platinum and vanadium.

According to one example, the metal layer is formed by conformal deposition of metal on the transistor pattern and on the protective layer on the front face of the substrate.

According to one example, the metal layer is formed by CVD (Chemical Vapour Deposition) or ALD (Atomic Layer Deposition). This allows the at least one metal species to be deposited on the sidewalls of the gate.

According to one example, the metal layer is formed by PVD (Physical Vapour Deposition) with conditions that allow for redeposition or sputtering (resputtering) from the bottom of the patterns to the sidewalls of the gate, typically by plasma treatment. According to one example, the metal layer is formed by low directional PVD. This allows the at least one metal species to be deposited on the sidewalls of the gate.

According to one example, lateral diffusion is configured so as to propagate the at least one metal species from each of the sidewalls of the gate at least to the centre of the gate, such that the superconducting region is formed across an entire width $L_g$ of the gate. The gate is thus entirely superconducting. This improves the control of the quantum device thus formed.

According to one example, the gate has a width $L_g \leq 40$ nm, preferably $L_g \leq 30$ nm, more preferably $L_g \leq 25$ nm, most preferably $L_g \leq 20$ nm. This reduces the total number of entangled qubits in the device.

According to one example, the gate has a width $L_g$ and the metal layer formed has a thickness $e_m \geq L_g/5$. This ensures that there is a sufficient amount of metal species in the metal layer, such that the entire gate can be made superconducting as a result of the lateral diffusion. The thickness $e_m$ can also depend on the metal used and/or the nature of the gate.

According to one example, lateral diffusion is achieved by thermal annealing, for example by RCA (Rapid Thermal Annealing). The conditions for lateral diffusion or lateral silicidation can in particular depend on the metal used and the target phase. The table below gives examples of thickness ratios between different metals (Co, Pt and V) and silicon. The annealing environment can be in an Ar, He or $N_2$ inert gas.

| Metal (nm) | Silicon (nm) | Silicide formed (nm) | T ° C. range Advantageous range | Time range Advantageous range | Annealed in Ar, He |
|---|---|---|---|---|---|
| Pt 1.00 | Si 1.35 | PtSi 1.98 | 400° C. to 700° C. 450° C. to 550° C. | 10 s to 300 s 60 s to 120 s | A single RTA-type anneal |
| 2 Co 1.00 | Si 0.91 | Co$_2$Si 1.47 | 550° C. to 900° C. 600° C. to 800° C. | 10 s to 300 s 60 s to 120 s | 2 RTA-type annealing steps |

-continued

| Metal (nm) | Silicon (nm) | Silicide formed (nm) | T ° C. range Advantageous range | Time range Advantageous range | Annealed in Ar, He |
|---|---|---|---|---|---|
| V 1.00 | Si 0.48 | V3Si 1.26 | 600° C. to 1000° C. 750° C. to 850° C. | 10 s to 1000 s 60 s to 500 s | A single RTA-type anneal |

In the case of lateral silicidation, the thickness of the Si consumed is preferably less than or equal to half the gate width. This prevents the formation of a polyphase superconducting zone.

According to one example, the protective layer formed at the front face of the substrate has a thickness $e'_s$ greater than or equal to 2 nm during the formation of the superconducting region. This improves the sealing of the protective layer against the diffusion of metal species.

According to one example, the formation of the protective layer comprises the following sub-steps of:
Oxidising, in a differentiated manner, the front face of the substrate and the sidewalls of the gate, such that the thickness ef of oxide formed at the sidewalls of the gate is strictly less than the thickness es of oxide formed at the front face of the substrate, such that ef≤k·es where k≤0.8 and preferably k≤0.5,
Removing the oxide formed at the sidewalls of the gate, said removal being configured to retain at least some of the oxide formed at the front face of the substrate.
Such differentiated oxidation is easily controlled.

According to one example, differentiated oxidation is carried out using at least one plasma comprising oxygen-based species and hydrogen-based species.

According to one example, the hydrogen-based species are chosen from dihydrogen H2, ammonia NH3 and boron hydride HBr.

According to one example, the at least one plasma comprises:
a first anisotropic hydrogen-based plasma mainly directed in a direction normal to the front face of the substrate, said first plasma being configured to modify a substrate portion to a depth ds from the front face, and to modify a gate portion over a width df from the sidewalls, where df≤k·ds, where k≤0.8 and preferably where k≤0.5,
a second oxygen-based plasma configured to oxidise the modified substrate and gate portions.
The substrate and gate portions are thus modified and then oxidised sequentially. This improves control of the differentiated oxidation, in particular in terms of depth ds and thickness df.

According to one example, the first plasma follows the second plasma.

According to one example, the first plasma is a hydrogen H2 plasma and the second plasma is an oxygen O2 plasma.

According to one example, the first and second plasmas are carried out simultaneously using HBr/O2 plasma chemistry. This reduces the number of steps. HBr/O2 plasma chemistry can also be used to etch and form the transistor pattern. The steps of providing the transistor pattern and of forming the protective layer can thus be partly combined.

According to one example, the oxide formed at the sidewalls of the gate is removed by wet etching.

According to one example, the formation of the protective layer comprises the following sub-steps of:
Depositing an oxide on the front face of the substrate and on the sidewalls of the gate,
Partially removing the oxide deposited so as to leave an oxide layer on the front face of the substrate, said oxide layer having a thickness es greater than or equal to the thickness eg of the gate dielectric of the transistor pattern. This prevents the subsequent formation of a recess in the substrate.

According to one example, the sidewalls of the gate are exposed over at least 90% of the height $h_g$ thereof, after the deposited oxide has been removed.

According to one example, the oxide is deposited by spinning.

According to one example, the substrate carries a plurality of transistor patterns.

According to one example, a subset of the plurality of transistor patterns is masked prior to the formation of the metal layer so as to prevent the formation of superconducting regions in the gates of the transistor patterns of said subset. This allows quantum devices to be co-integrated with transistors, for example FDSOI CMOS transistors, on the same substrate.

Unless specifically indicated otherwise, technical features described in detail for a given embodiment can be combined with the technical features described within the context of other embodiments described by way of example and in a non-limiting manner. In particular, the shape or number of the source and drain regions shown in the figures can be combined to form another embodiment which is not necessarily illustrated or described. It goes without saying that such an embodiment is not excluded from the scope of the invention.

It is specified that, within the scope of the present invention, the terms "on", "overlying", "covers" or "underlying" or the equivalents thereof do not necessarily mean "in contact with". Thus, for example, a hard mask on a gate does not necessarily mean that the hard mask and the gate are directly in contact with one another, but rather means that the hard mask covers at least partially the gate while being either directly in contact therewith, or while being separated therefrom by at least one other layer or at least one other element.

Moreover, a layer can be constituted by a plurality of sub-layers made of the same material or made of different materials.

A substrate, layer, or device, "based on" a material M is understood to mean a substrate, a layer, or a device comprising this material M only or comprising this material M and optionally other materials, for example alloying elements, impurities or doping elements. Thus, a spacer having a silicon nitride SiN base can, for example, comprise non-stoichiometric silicon nitride (SiN) or stoichiometric silicon nitride (Si3N4), or even a silicon oxynitride (SiON).

Typically, but in a non-limiting manner, a spacer forms a ring around the gate with a closed contour; the description of a spacer preferably refers to this single spacer around the gate; however, illustrative sectional drawings, generally viewed along a plane parallel to the longitudinal direction of the channel, show two spacer parts on either side of the sidewalls of the gate. By extension, these two spacer parts are often referred to as "the spacers". The latter terminology may be adopted in this application. Furthermore, the invention relates to embodiments wherein at least two discontinuous spacers cover a gate pattern.

The present invention in particular allows at least one quantum device or a plurality of quantum devices to be manufactured on a substrate. This substrate can be a "bulk" substrate, or even of the semiconductor on insulator type, for example a silicon on insulator (SOI) substrate or a germanium on insulator (GeOI) substrate.

The invention can also be implemented more widely for various microelectronic devices or components.

A microelectronic component, device or device element is understood to mean any type of element made using microelectronic means. In addition to devices intended for purely electronic purposes, these devices in particular include micromechanical or electromechanical devices (MEMS, NEMS, etc.) as well as optical or optoelectronic devices (MOEMS, etc.).

Several embodiments of the invention implementing successive steps of the manufacturing method are described hereinbelow. Unless specified otherwise, the adjective "successive" does not necessarily imply that the steps immediately follow on from one another, although this is generally preferred, and they can be separated by intermediate steps. Moreover, the term "step" is understood to mean the performance of a part of the method, and can denote a set of sub-steps.

In particular, the step of forming the protective layer can occur in part at the end of the step of providing the transistor pattern, such that these two steps are partly coincident. This is the case, for example, when a HBr/O2 plasma is used to etch and form the transistor pattern. This plasma can be extended, preferably by varying the conditions of said plasma, so as to form the protective layer.

The term "dielectric" qualifies a material whose electric conductivity is low enough in the given application to act as an insulator. In the present invention, a dielectric material preferably has a dielectric constant of less than 7. The spacers are typically made of a dielectric material.

The terms "gate pattern", "gate stack" and "gate" are used synonymously.

"Etching selectively to" or "etching with selectivity to" are understood to mean an etch that is configured so as to remove a material A or a layer A from a material B or from a layer B, and having an etch rate of the material A that is greater than the etch rate of the material B. Selectivity is the ratio of the etch rate of the material A to the etch rate of the material B.

The present patent application preferentially employs the term thickness for a layer, height for a device (for example a gate) and depth for a recess or an etch. The thickness is considered in a direction normal to the main plane of extension of the layer, the height and the depth are considered in a direction normal to the base plane of the substrate. The main extension plane of the layer, respectively the base plane of the substrate, is generally parallel to a bottom face or top face of this layer, respectively of this substrate.

In the present patent application, a preferably orthonormal coordinate system formed by the axes x, y, z is shown in the accompanying drawings. The substrate, more specifically the bottom face and/or the top face thereof, extends in the basal plane xy.

In the description hereafter, the length is considered in the direction shown by the x-axis, referred to as the longitudinal axis, and the width is considered in the direction shown by the y-axis.

An element located "vertical to" or "in line with" another element means that these two elements are both located on the same line perpendicular to the basal plane, i.e. on the same line oriented along the z-axis in the figures.

"Horizontal" is understood to mean an orientation parallel to a plane xy. "Vertical" is understood to mean an orientation parallel to the z-axis.

The terms "substantially", "about", and "in the order of" mean "to within 10%" or, when referring to an angular orientation, "to within 10°". Thus, a direction substantially normal to a plane means a direction having an angle of 90±10° relative to the plane.

The invention will now be described in detail by way of several non-limiting embodiments.

A first embodiment of the method is shown in FIGS. 3 and 4A-4J. In this first embodiment, a quantum device with at least two qubits is formed, these qubits being electron spin qubits or superconducting qubits.

Figure 4A:
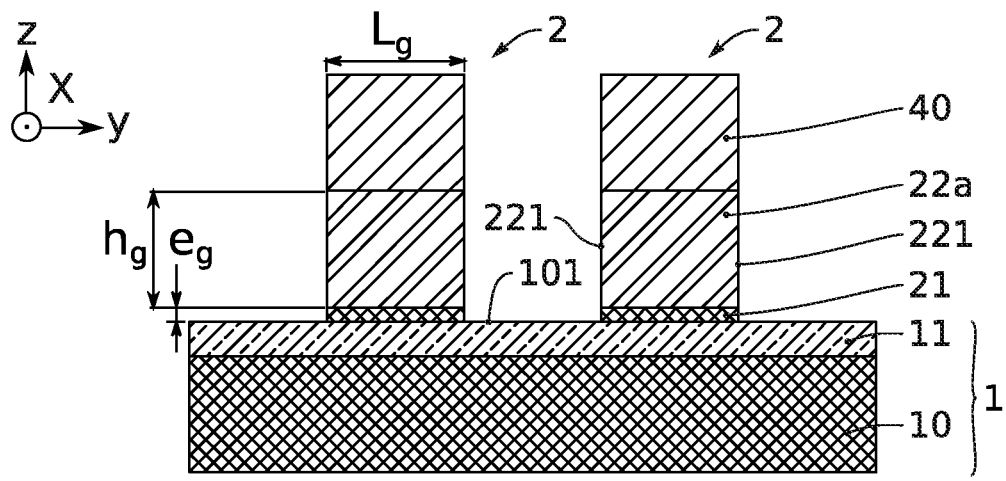
FIG. 4A to 4J diagrammatically show the steps involved in forming a quantum device according to a first embodiment of the method according to the present invention.

Two transistor patterns 2 each comprising a gate dielectric 21, a gate 22a and a hard mask 40 stacked on a substrate 1 are provided 100 (FIG. 4A). The substrate 1 is typically an SOI substrate in this case, comprising an active region 11 on a buried oxide 10. The gate dielectric 21 typically has, as a main component, silicon dioxide SiO2, or a material with a high dielectric constant. The gate dielectric 21 typically has a thickness $e_g$ comprised between 1 nm and 5 nm. The gate 22a typically has, as a main component, polycrystalline silicon (polySi). The gate 22a typically has a width $L_g$ of less than 25 nm and a height $h_g$ comprised between 20 nm and 150 nm. The hard mask 40 typically has, as a main component, silicon nitride SiN or SiO2.

According to another embodiment, the device is produced on a solid silicon substrate. In such a case, a dopant introduction step can be provided in order to ensure electron confinement, and/or dielectric materials, other than silicon oxide, can be provided. These dielectrics are, for example, nitride- or alumina-based.

The provision 100 of the two transistor patterns 2 corresponds, in this case, to the formation of these transistor patterns 2. In particular, the gates 22a are etched by conventional plasma etching, for example using HBr/O2 plasma. After this etching, a protective layer 111 (FIG. 4B) on the front face 101 of the substrate 1 can be formed 110 via an over-etching step directly following the etching of the gates 22a. This over-etching step aims to procure differentiated oxidation 111a of the sidewalls 221 and of the front face 101.

Figure 4B:
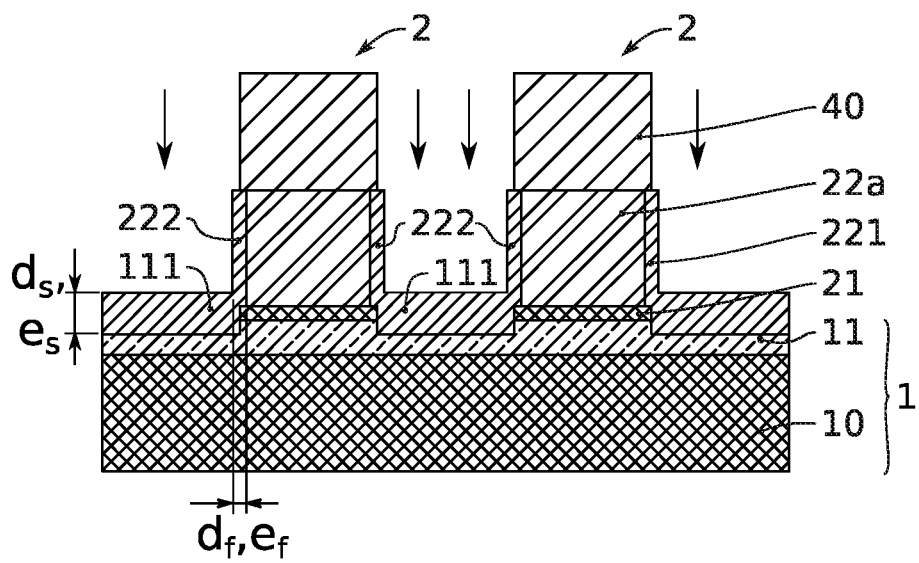

In particular, the sidewalls 221 of each gate 22a are oxidised to a thickness $e_f$ to form the oxide 222 (FIG. 4B). The front face is oxidised to a thickness $e_s$ to form the oxide 111 (FIG. 4B). The differentiated oxidation 111a is configured such that the thickness $e_f$ of the oxide 222 is strictly less, for example at least 20% less and preferably at least 50% less, than the thickness $e_s$ of the oxide 111. The thickness $e_f$ of the oxide 222 can be comprised between 1 nm and 4 nm. The thickness $e_s$ of the oxide 111 can be comprised between 3 nm and 10 nm.

This over-etching step can be carried out using a hydrogen-based plasma and an oxygen-based plasma. According to one example, the HBr/O2 plasma used to etch the gates 22a is adapted to oxidise, in a differentiated manner, the sidewalls 221 and the front face 101 at the end of the etching of the gates 22a. For example, the HBr/O2 mixture is 40:1 (for example 200 sccm HBr to 5 sccm O2). The pressure is less than 50 mTorr, preferably less than 10 mTorr (for example 6 mTorr). The source power is greater than 200 W, preferably greater than 400 W (typically 500 W). The bias voltage is greater than 50 V, preferably greater than 60 V (typically 80 V). The temperature of the substrate is comprised between 50° C. and 70° C., preferably in the order of 60° C.

According to another example, the over-etching step is carried out sequentially by a first hydrogen-based plasma, for example having, as a main component, dihydrogen H2 or ammonia NH3, followed by a second oxygen-based plasma O2. The first plasma is used in this case to modify both the material of the active layer 11 to a depth $d_s$ from the front face 101, and the material of the gate 22a over a width $d_f$ from the sidewalls 221. The portions modified by this first plasma are not etched. This first plasma is configured such that the width $d_f$ is strictly less, for example at least 20% less and preferably at least 50% less, than the depth $d_s$. The width $d_f$ can be comprised between 1 nm and 4 nm. The depth $d_s$ can be comprised between 3 nm and 10 nm.

The second plasma allows the portions of the active layer 11 and of the gate 22a modified by the first plasma to be oxidised. This forms the oxide 111 of thickness $e_s$ and the oxide 222 of thickness $e_f$. In a known manner, the oxide formed by oxidation of silicon can be larger in volume than the silicon consumed during oxidation. Thus, the oxide 111 can typically extend beneath the front face 101 and above the front face 101, such that the depth $d_s$ is not necessarily equal to the thickness $e_s$.

Figure 4C:
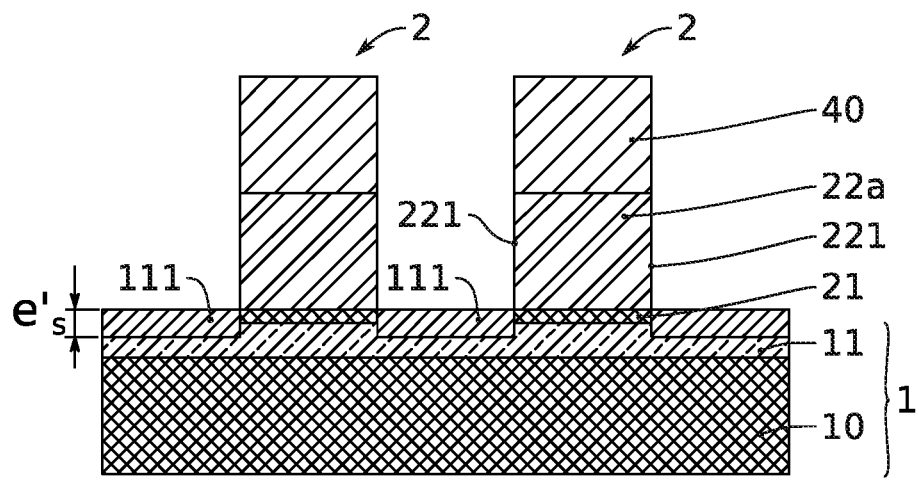

At the end of the over-etching step, a thin oxide 222 is formed on the sidewalls 221 of the gate 22a and a thick oxide 111 is formed on the front face 101 of the active layer 11. The next step involves removing 111b the thin oxide 222 from the sidewalls 221 of the gate 22a (FIG. 4C). This removal 111b can be carried out by wet etching, for example with dilute hydrofluoric acid dHF (HF concentration in the order of 0.1% to 1%). According to one possibility, this removal 111b is carried out by a SiCoNi™ type method, which typically comprises a delocalised plasma based on a NF3/NH3 mixture followed by sublimation annealing. After removal 111b, part of the oxide 111 on the front face is retained and has a thickness $e'_s < e_s$. This oxide part 111 forms the protective layer 111 of thickness $e'_s$ (FIG. 4C). The thickness $e'_s$ is greater than or equal to 2 nm.

Figure 4D:
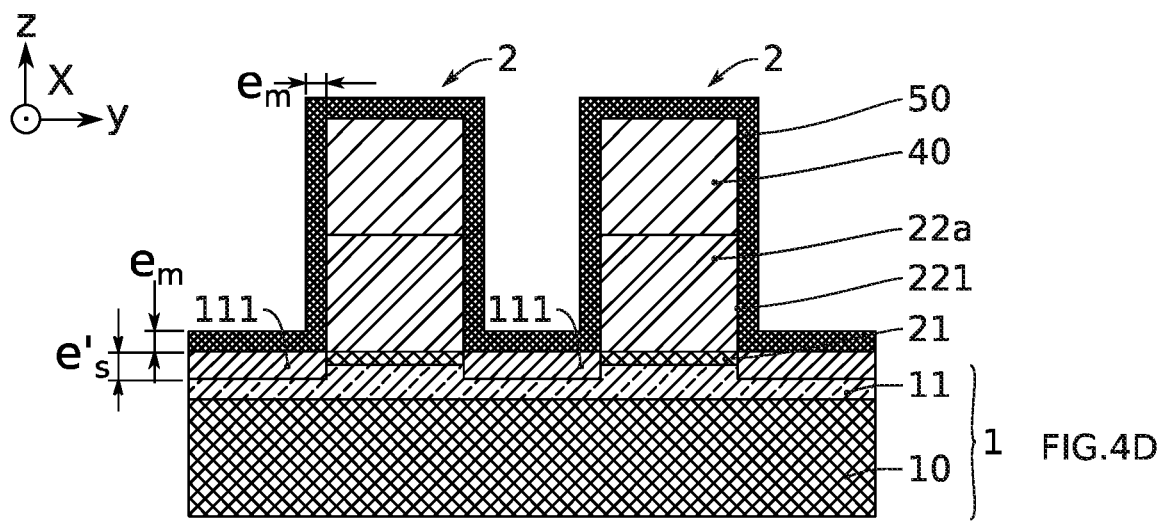

After removal 111b, the sidewalls 221 of the gate 22a are exposed again. Prior to the deposition of a metal layer 50, the sidewalls 221 can be cleaned, for example by argon or helium plasma. The metal layer 50 can be conformally deposited on the transistor patterns 2 and on the protective layer 111 (FIG. 4D). The metal layer 50 covers in particular the sidewalls 221. This metal layer 50 comprises at least one superconducting element, for example chosen from cobalt, platinum or vanadium. It has a thickness $e_m$. This thickness $e_m$ is preferably chosen such that the entire gate 22a is transformed into a superconducting region after the subsequent lateral diffusion step. In particular, for a polySi gate 22a, the superconducting silicide formed from the lateral diffusion into the gate 22a of the superconducting elements of the metal layer 50, for example cobalt silicide CoSi2, platinum silicide PtSi, vanadium silicide V3Si, has a width $L_{super}$ that is proportional to the width $L_{Si}$ of polySi consumed during the transformation, such that $L_{super} = \alpha \cdot L_{Si}$, where $1.5 \leq \alpha \leq 2.5$. Since diffusion takes place from each of the sidewalls 221 of the gate 22a, the width $L_{super}$ required to transform the gate 22a into the superconducting region is equal to $L_g/2$. Thus, a thickness $e_m$ of metal layer 50 greater than or equal to the width $L_{Si}$ of polySi consumed during the transformation allows the gate 22a to be silicided over the entire width $L_g$ thereof. It is thus preferable to choose $e_m \geq L_g/2\alpha$, i.e. $e_m \geq L_g/5$.

Figure 4E:
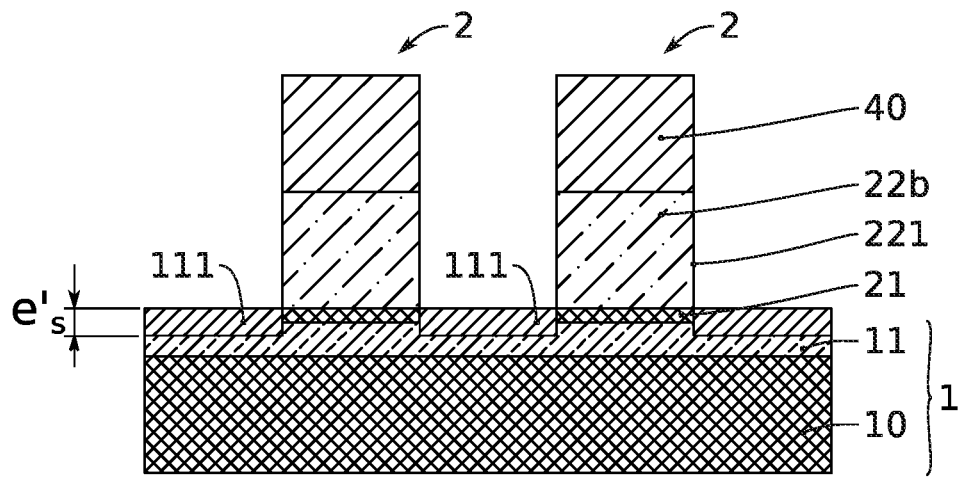

The superconducting region 22b is formed 120 within the gate 22a by lateral diffusion of the metal species from the sidewalls 221, i.e. mainly along y. This lateral diffusion is preferably configured such that the superconducting region 22b is formed over the entire width $L_g$ of the gate 22a, (FIG. 4E). Typically two diffusion fronts develop from the two respective sidewalls of the gate 22a. These diffusion fronts are substantially vertical and progress towards the median plane xz of the gate 22a. The gate 22a is completely transformed into a superconducting region 22b when the fronts meet at this median plane xz. Preferably, the presence of the hard mask 40 advantageously prevents diffusion of the metal species from the top of the gate 22a. This prevents a third diffusion front from developing from the top. The crystal quality of the superconducting region 22b formed by the lateral junction between two diffusion fronts is better than the crystal quality of a superconducting region 22b formed by the junction between three fronts. The latter embodiment with three diffusion fronts, although more complicated to implement, nonetheless remains possible. Diffusion of the metal species within the gate 22a is typically achieved by thermal annealing, for example at a temperature of 400 to 800° C. The diffusion conditions typically depend on the chosen metal species and its reactivity with silicon. Examples are provided in the table hereinabove.

Advantageously, the protective layer 111 prevents the metal species from diffusing in the active layer 11. After formation 130 of the superconducting region 22b, the metal residues are preferably cleaned, for example with a hydrogen peroxide H2O2-based solution, such as Caro's acid ($H_2O_2$:$H_2SO4$), or aqua regia (HCl:HNO3) and/or with an SC1 ($H_2O$:$H_2O_2$:$NH_4OH$).

Figure 4F:
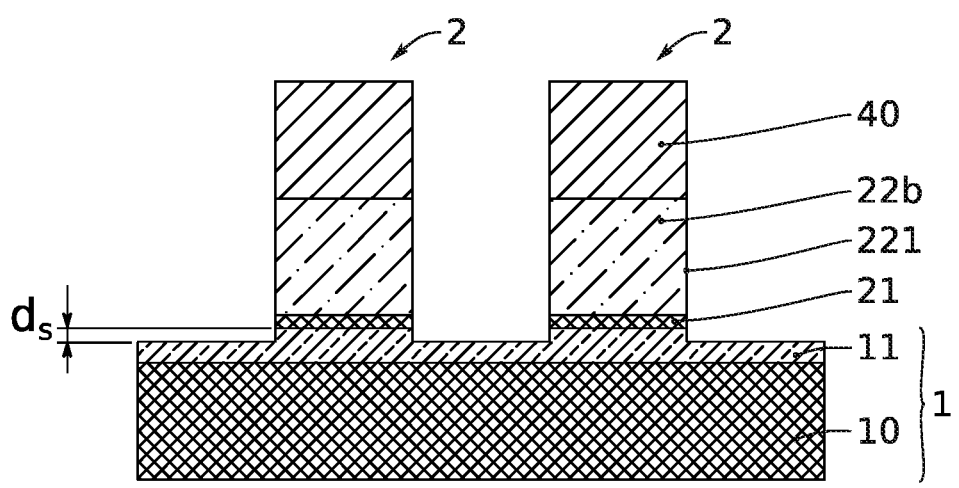

The protective layer 111 can then be removed 140a to expose the active layer 11 (FIG. 4F). This removal 140a can be carried out by wet etching, for example with hydrofluoric acid HF. The removal 140a of this protective layer 111 takes place before the step 300 of epitaxially growing the source and drain regions. This removal can thus be carried out directly after the formation 130 of the superconducting region 22b, or at a later stage, for example after the formation 200 of the spacers. The latter possibility can in particular improve the quality of the interface between the active layer 11 and the future spacer 20.

Figure 4G:
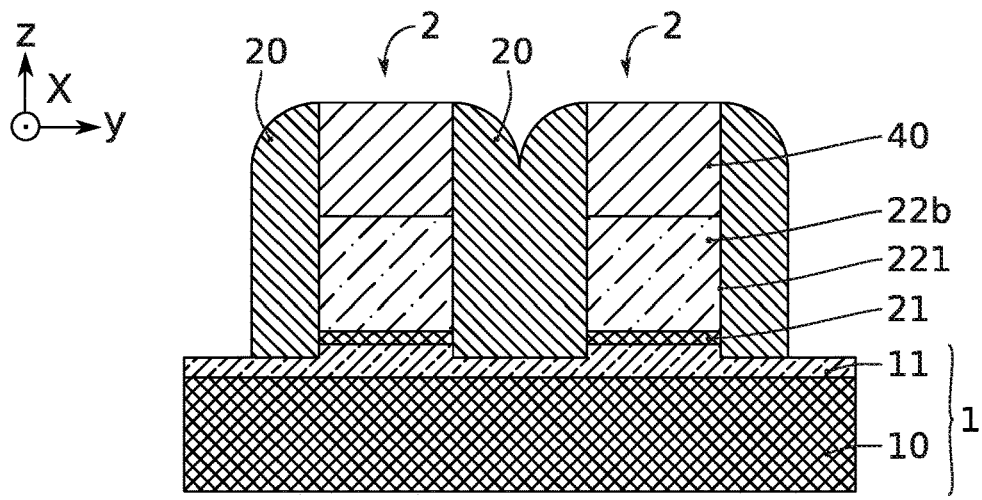
Figure 4H:
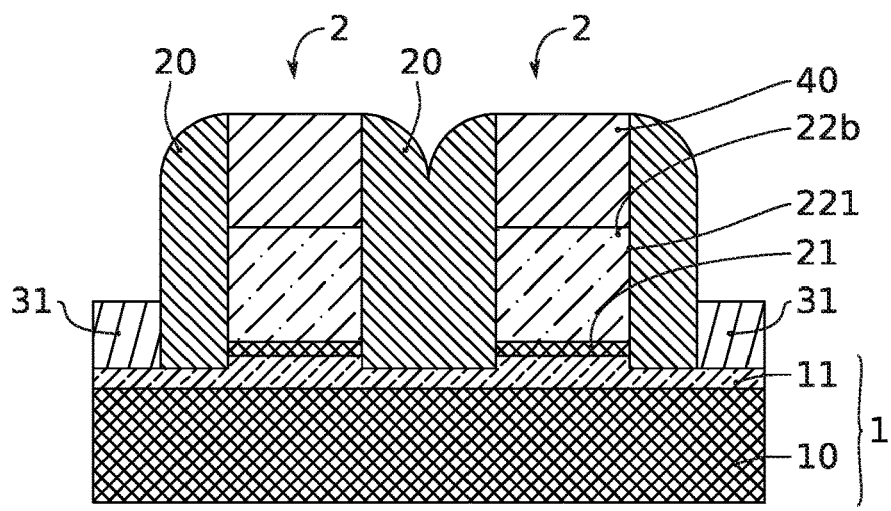

As shown in FIG. 4G, the one or more spacers 20 are formed 200 on either side of the gate patterns. The formation of SiN-based spacers 20 is a very well-known standard step. The source and drain regions 31 are then formed 300 around the outer spacers 20 (FIG. 4H). These regions 31 are typically formed by epitaxy along z from the exposed zones of the active layer 11. This allows, in a known manner, raised source/drain (RSD) regions 31 to be obtained.

Figure 4I:
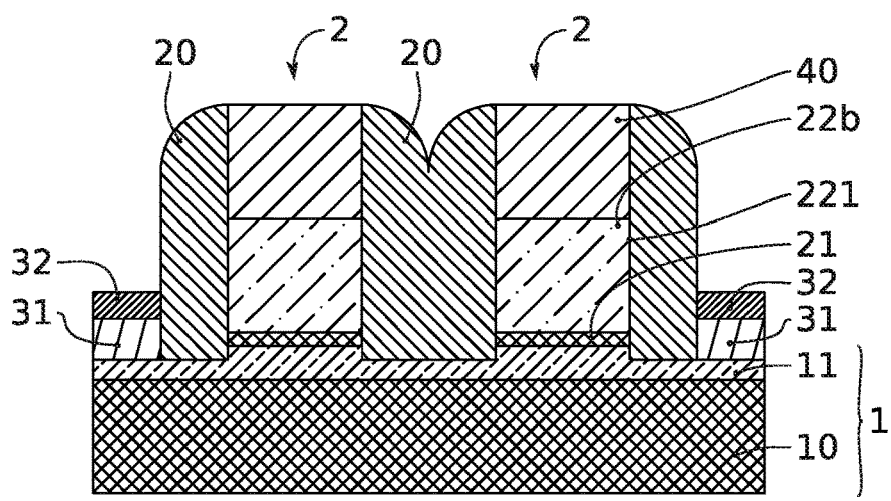
Figure 4J:
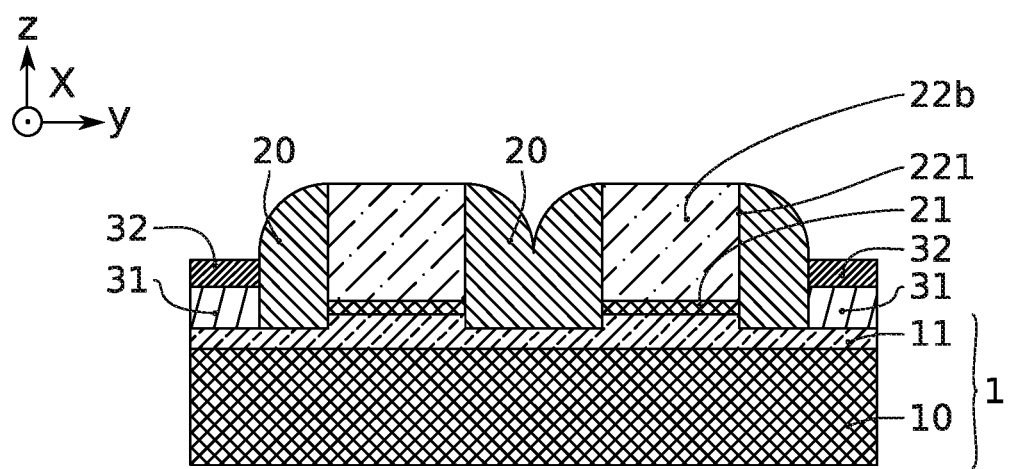
Figure 5:
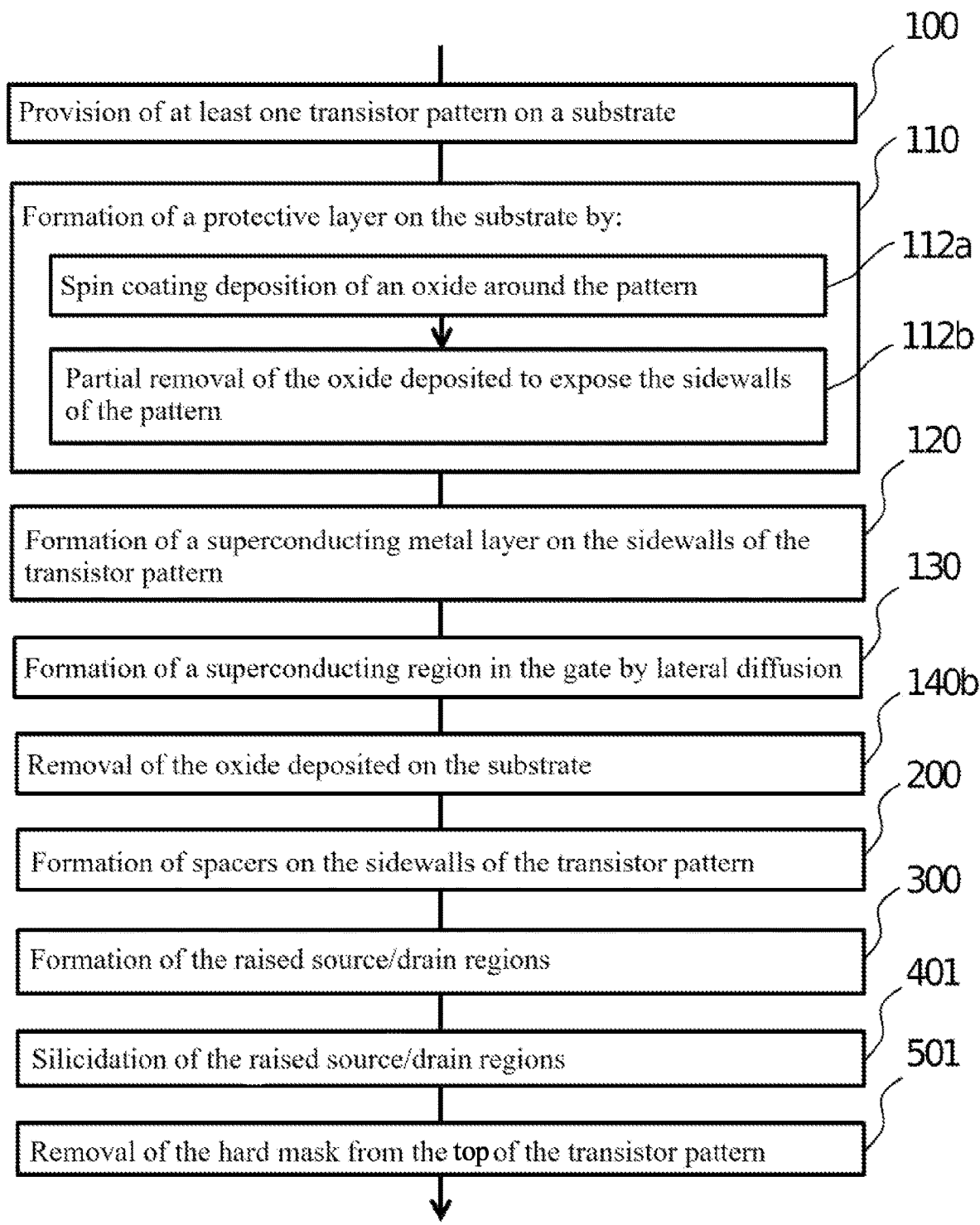
FIG. 5 shows a diagram illustrating the steps involved in producing a quantum device according to a second embodiment of the method according to the present invention.

Standard silicidation 401 of the source and drain regions 31 can then be carried out to form silicided portions 32 (FIG. 4I). At this stage, the hard mask 40 is retained at the top of the superconducting region 22b so as to prevent further silicidation of the superconducting region 22b. The hard mask 40 can be removed 501 after silicidation of the source and drain regions 31, so as to expose the top of the superconducting region 22b, as shown in FIG. 4J. A two-qubit quantum device comprising at least two superconducting regions 22b is thus advantageously formed.

A second embodiment of the method is shown in FIGS. 5 and 6A-6J. In this second embodiment, a quantum device with two qubits is also formed, these qubits being electron spin qubits or superconducting qubits. In this embodiment, the formation 110 of the protective layer differs from that of the previous embodiment. Only those features that differ from the first embodiment are described hereinbelow; other features not described must be considered to be identical.

Two transistor patterns 2 each comprising a gate dielectric 21, a gate 22a and a hard mask 40 stacked on a substrate 1 are in this case provided 100 (FIG. 6A) independently of the step 110 of forming the protective layer.

Figure 6A:
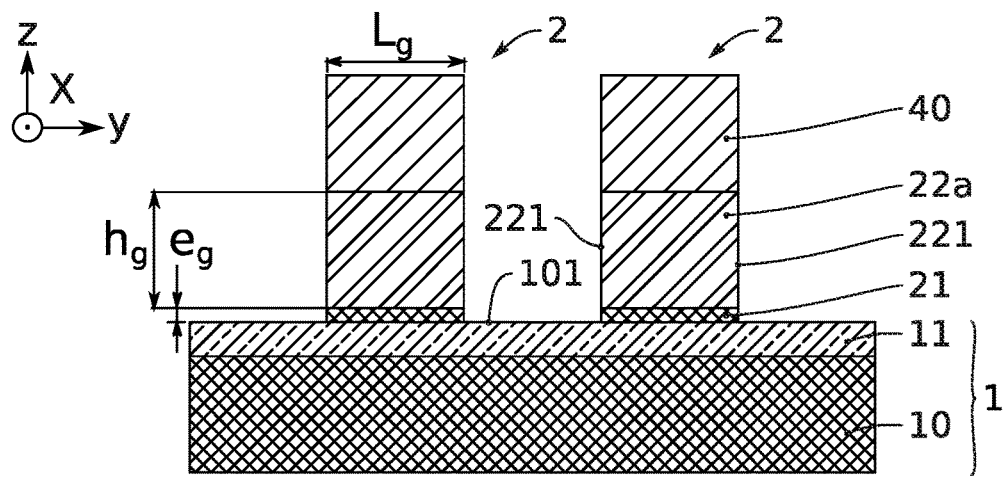
FIG. 6A to 6J diagrammatically show the steps involved in forming a quantum device according to a second embodiment of the method according to the present invention.
Figure 6B:
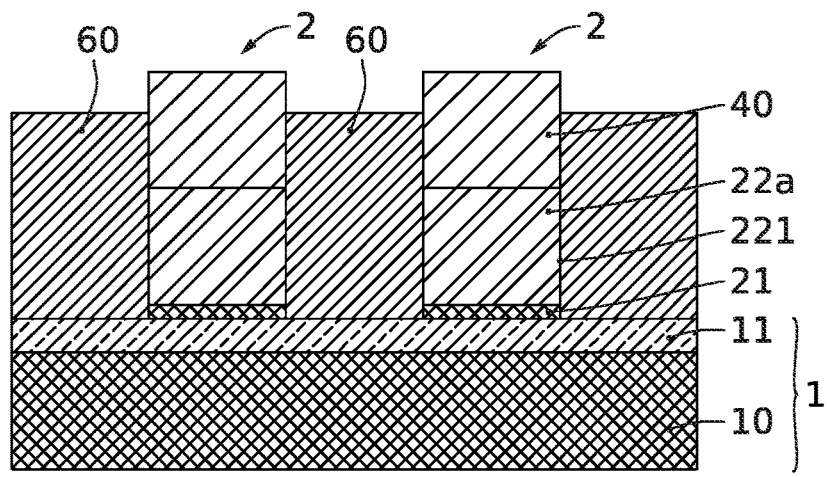

In this case, the formation 110 of the protective layer begins after the etching of the gates 22a. This formation 110 is typically carried out in two steps: an oxide layer 60 is firstly formed between the transistor patterns 2, on the front face 101, as shown in FIG. 6B. This oxide layer 60, for example a fluid oxide of the SoG type (acronym for Spin on Glass), can be deposited 112a by spinning. The spin coating conditions can be chosen as a function of the density of the transistor patterns 2 on the substrate, the height/width form factor of the gaps to be filled, and the desired oxide thickness 60. The speed of the coating machine is adapted, in a known manner, for homogeneous deposition over the entire wafer as is the duration of the method in order to control the thickness deposited. The oxide layer 60 is then solidified by annealing.

Figure 6C:
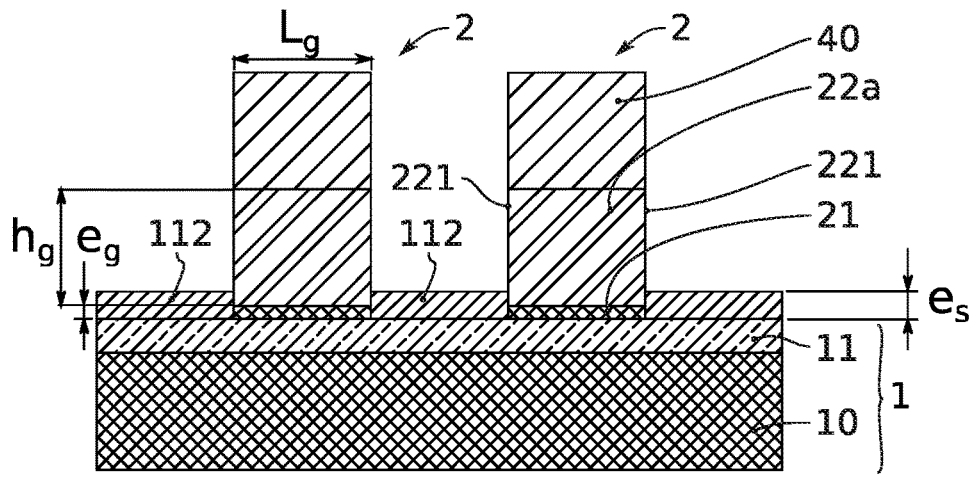

Partial removal 112b of this oxide layer 60 is then carried out to form a protective layer 112 of thickness $e_s$ (FIG. 6C). This removal 112b is preferably configured such that the thickness $e_s$ of the protective layer 112 is greater than 2 nm and/or greater than the thickness $e_g$ of the gate dielectric 21. This prevents any subsequent spurious diffusion of metal in the active layer 11, in particular at the base of the transistor patterns, vertical to the sidewalls 221.

This partial removal 112b can be carried out by HF-based wet etching or by fluorocarbon plasma etching. A HF solution diluted to the order of 0.1% to 1% is preferably used. This procures good etch selectivity relative to the gate 22a and/or to the hard mask 40. Removal 112b can also be carried out by a SiCoNi™ type method, which typically comprises a delocalised plasma having, as a main component, an NF3/NH3 mixture followed by sublimation annealing.

Figure 6D:
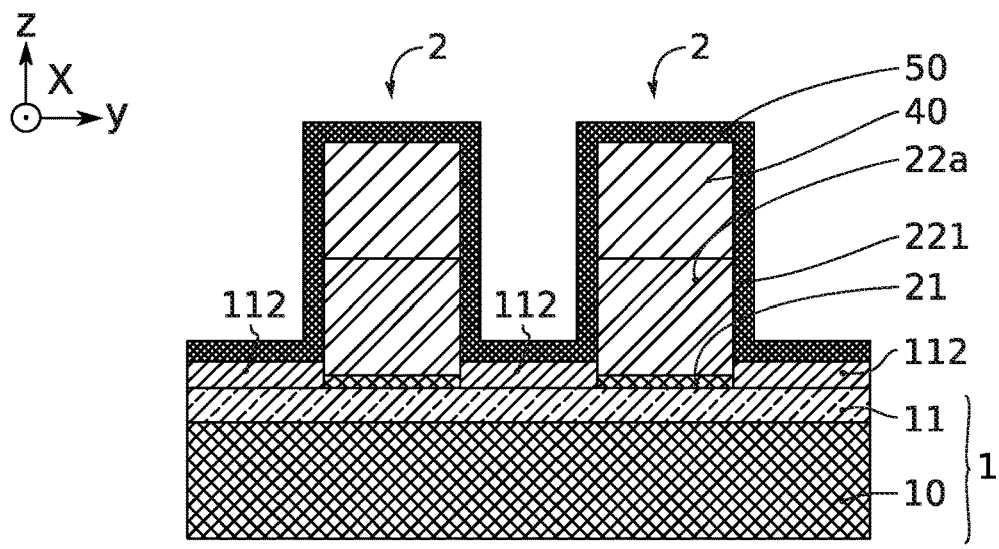
Figure 6E:
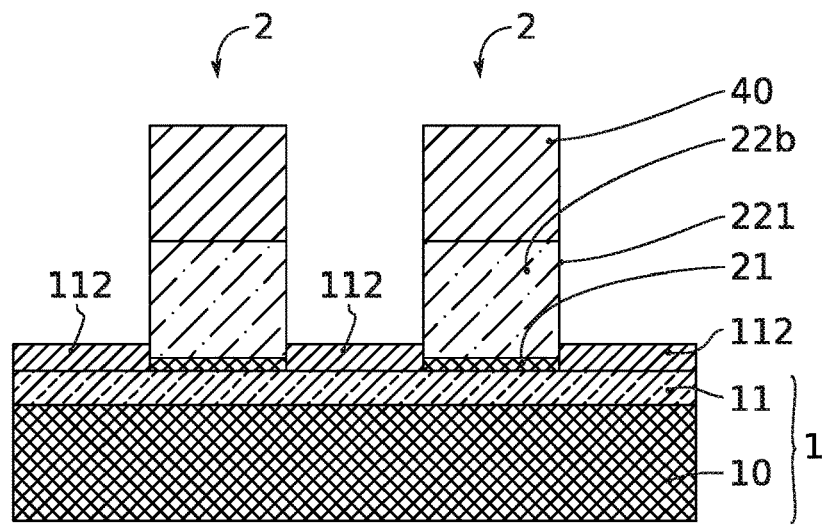

The sidewalls 221 of the gate 22a are partially exposed after this removal 112b, over at least 80% of the height $h_g$ thereof, and preferably over at least 90% of the height $h_g$ thereof. The metal layer 50 is then deposited 120 on the exposed sidewalls 221 of the transistor patterns, as shown in FIG. 6D. Lateral diffusion of the superconducting elements then takes place from the sidewalls 221 covered by the metal layer 50, so as to form 130 the superconducting region 22b, as described hereinabove (FIG. 6E).

Figure 6F:
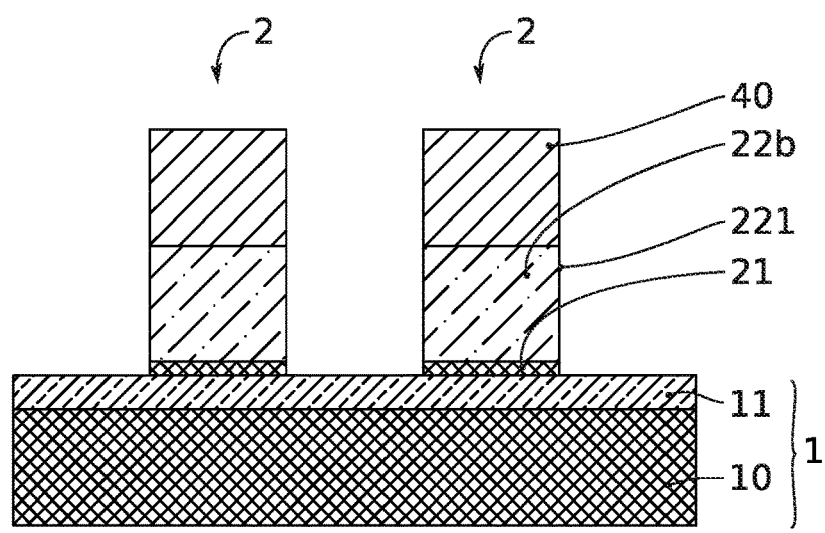
Figure 6G:
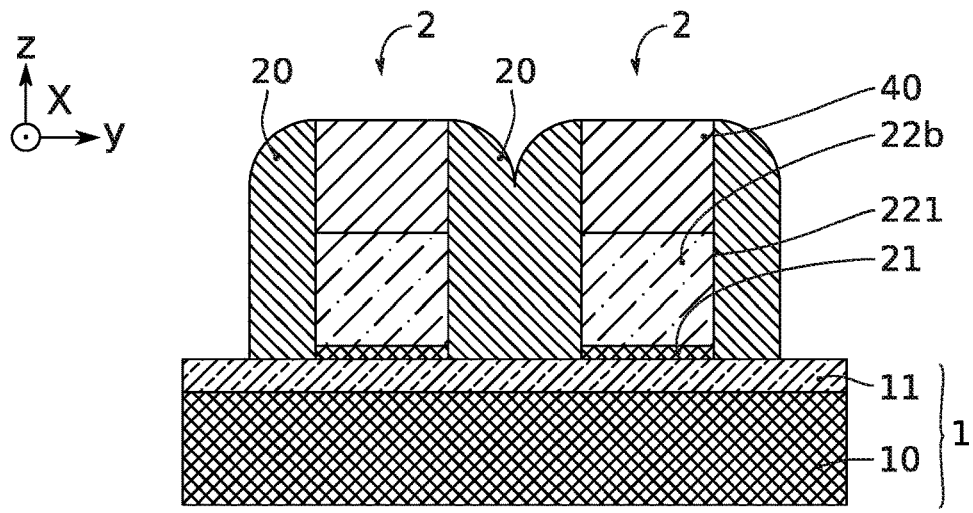
Figure 6H:
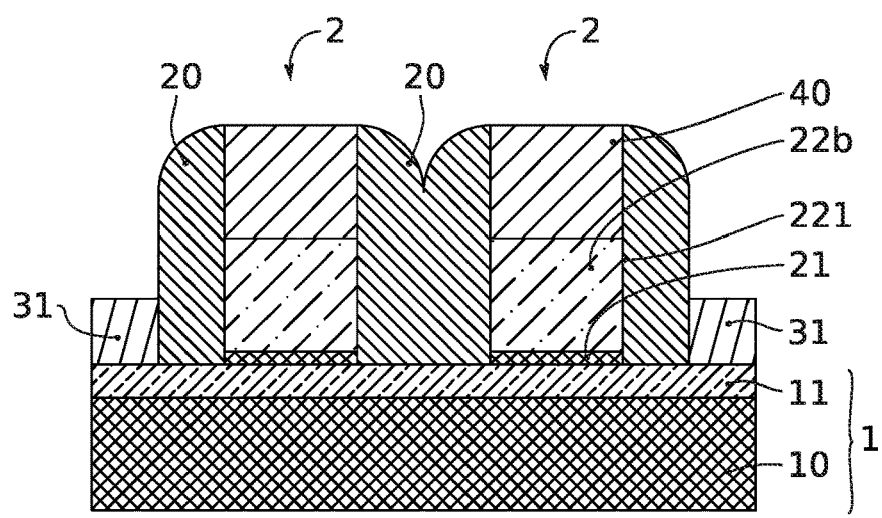
Figure 6I:
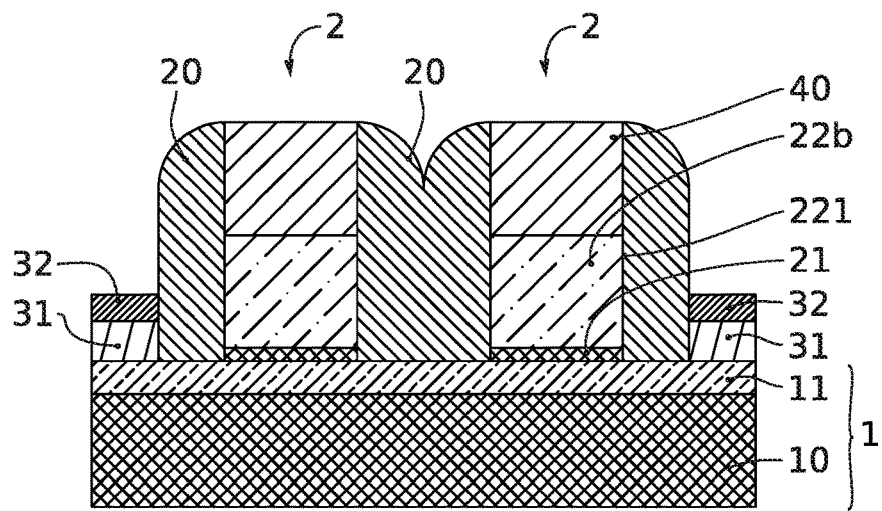

After the formation 130 of the superconducting region 22b, the metal residues are preferably cleaned and then the protective layer 112 is removed 140b so as to expose the front face 101 of the active layer 11 (FIG. 6F). This second embodiment thus makes it possible to keep the thickness of the active layer 11 substantially constant. This allows a sufficient active layer thickness to be retained, typically greater than 3 nm. Such a thickness of the active layer prevents agglomeration or balling phenomena affecting the active layer during subsequent high-temperature processes, for example during the epitaxial growth of the raised sources/drains RSD.

Figure 6J:
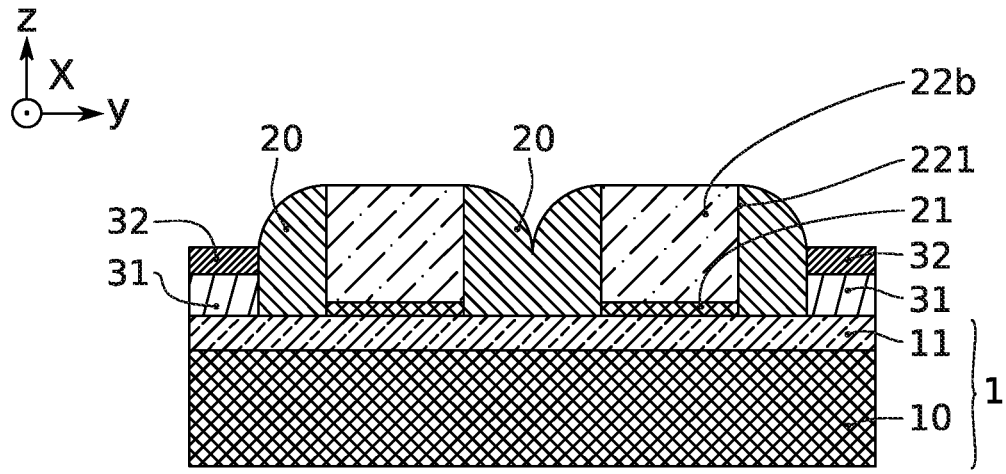

The subsequent steps of forming 200 the spacers 20 (FIG. 6G), and of forming 300 and siliciding 401 the source and drain regions 31 (FIG. 6H and 6I) are similar to those of the first embodiment described hereinabove. A two-qubit quantum device comprising two superconducting regions 22b is thus advantageously formed (FIG. 6J).

Figure 7A:
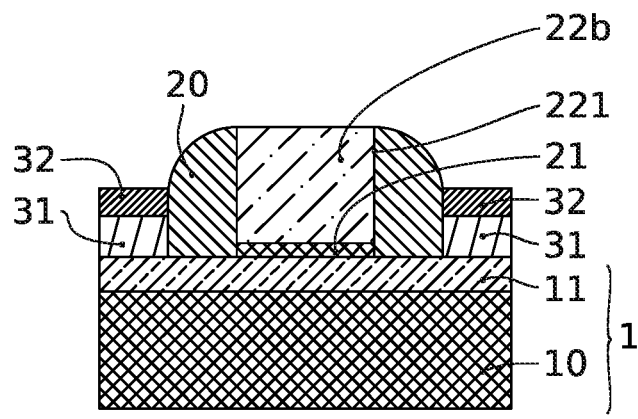
FIG. 7A diagrammatically shows a quantum device obtained from a third embodiment of the method according to the present invention.
Figure 7B:
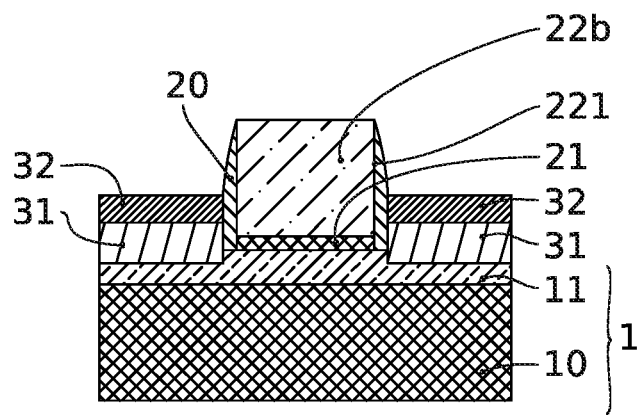
FIG. 7B diagrammatically shows a quantum device obtained from a fourth embodiment of the method according to the present invention.
Figure 7C:
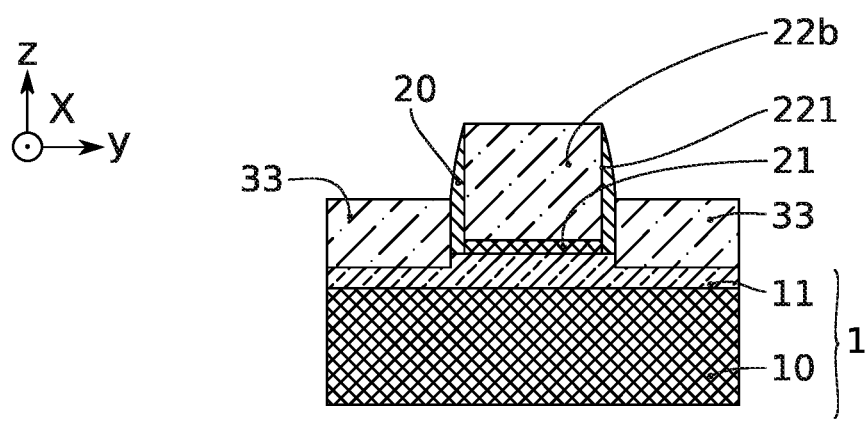
FIG. 7C diagrammatically shows a quantum device obtained from a fifth embodiment of the method according to the present invention.

Other embodiments are also possible. FIG. 7A, 7B, 7C, and FIGS. 8A-8F and 9A-9D show some of these embodiments in a non-limiting manner. In particular, production of a quantum device comprising a single superconducting region 22b (FIG. 7A) can be envisaged. Alternatively, or in combination therewith, the width of the spacers 20 can also be reduced, so as to bring the source and drain regions 31 closer to the channel (typically located beneath the superconducting region 22b). Alternatively or in combination therewith, the standard silicide 32 of the source and drain regions 31 can be replaced by a superconducting silicide 33, for example of the same nature as the superconducting region 22b (FIG. 7C). This can be of interest for certain applications, for example for transmon (superconducting charge qubit), gatemon (transmon with variable polarisation) or JoFET (FET with superconducting source and drain regions) applications.

Figure 8A:
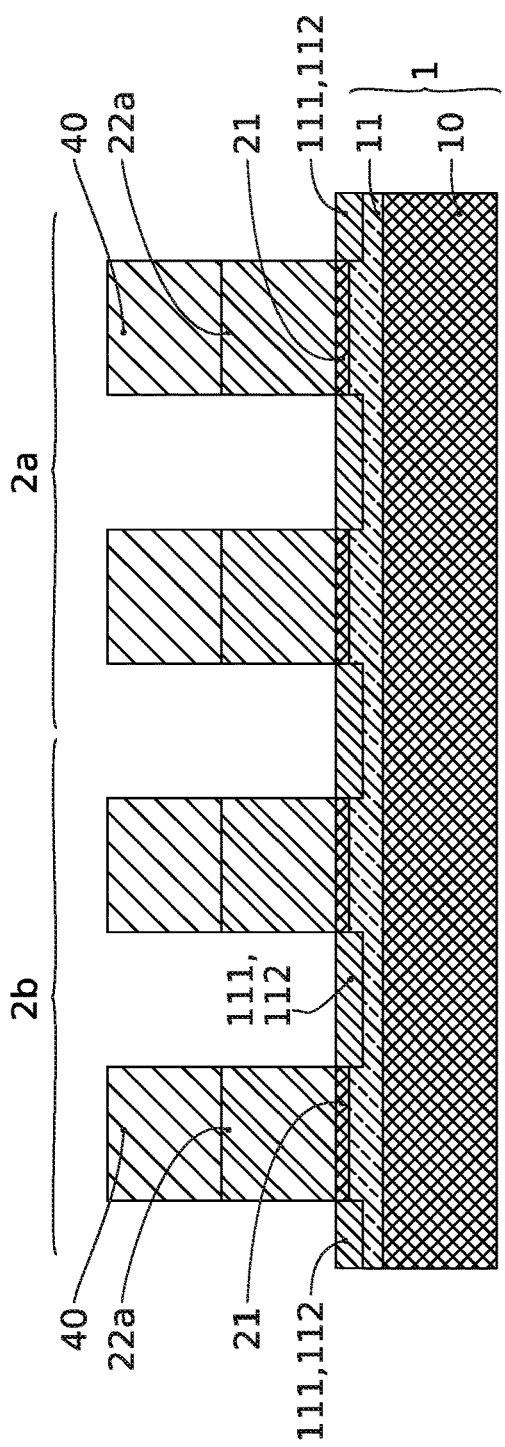
Figure 8B:
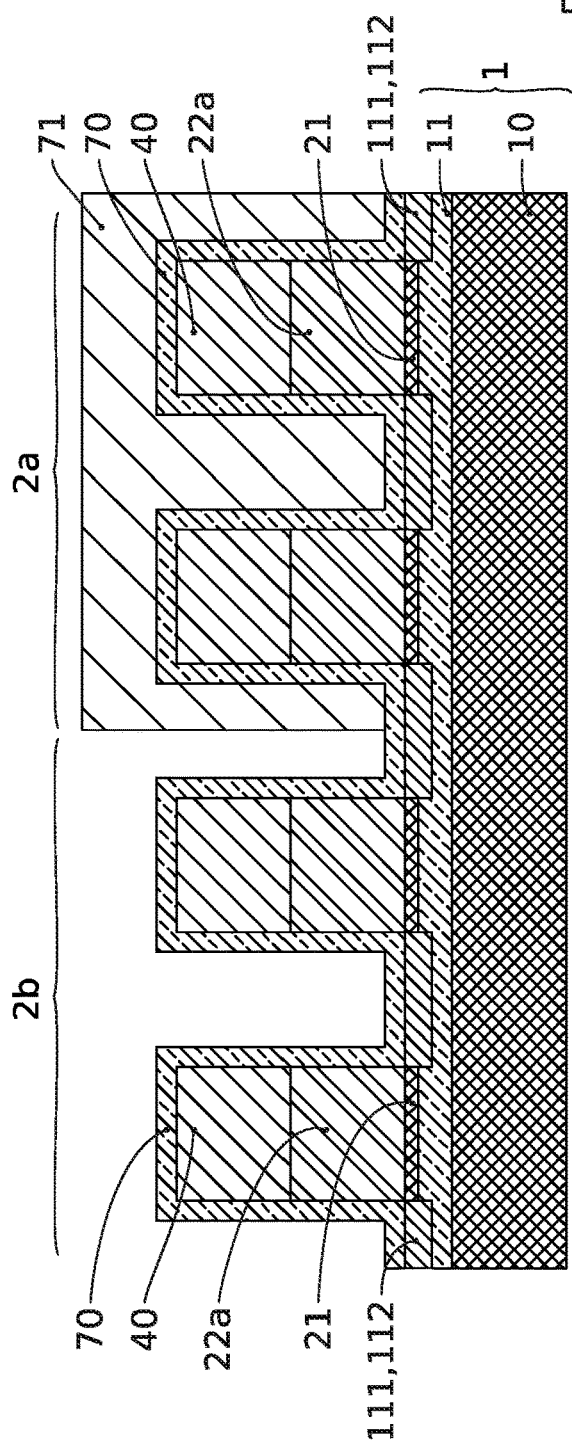
Figure 8E:
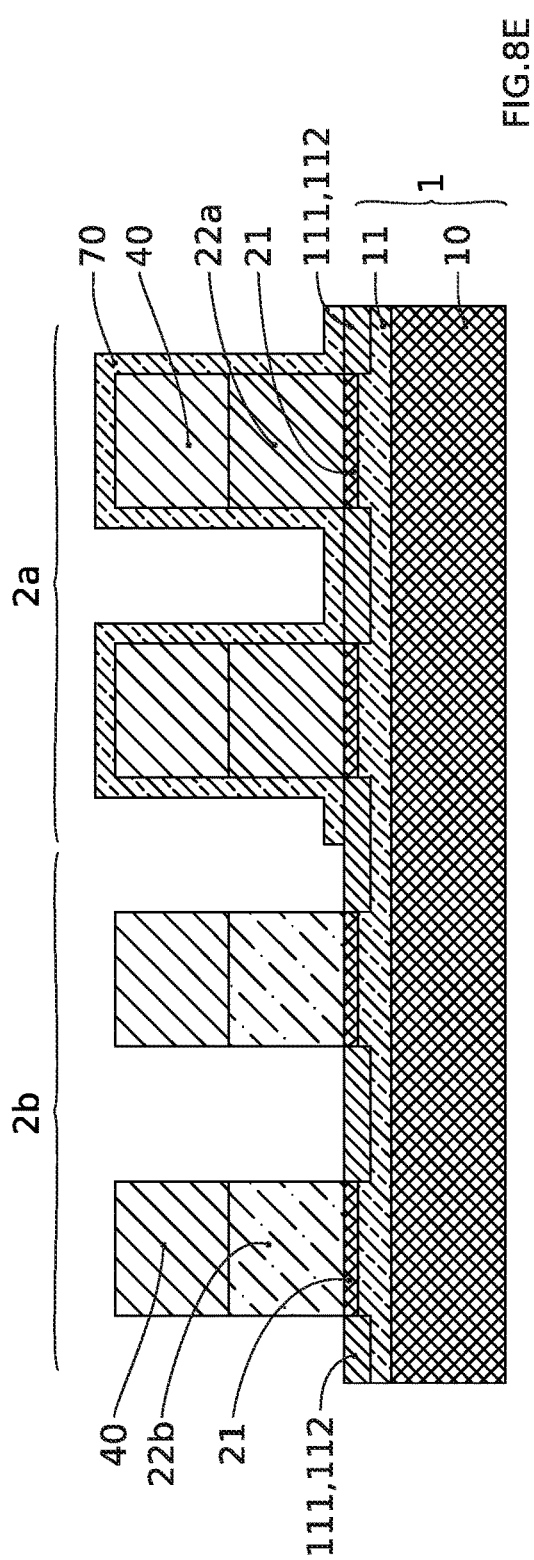
Figure 8F:
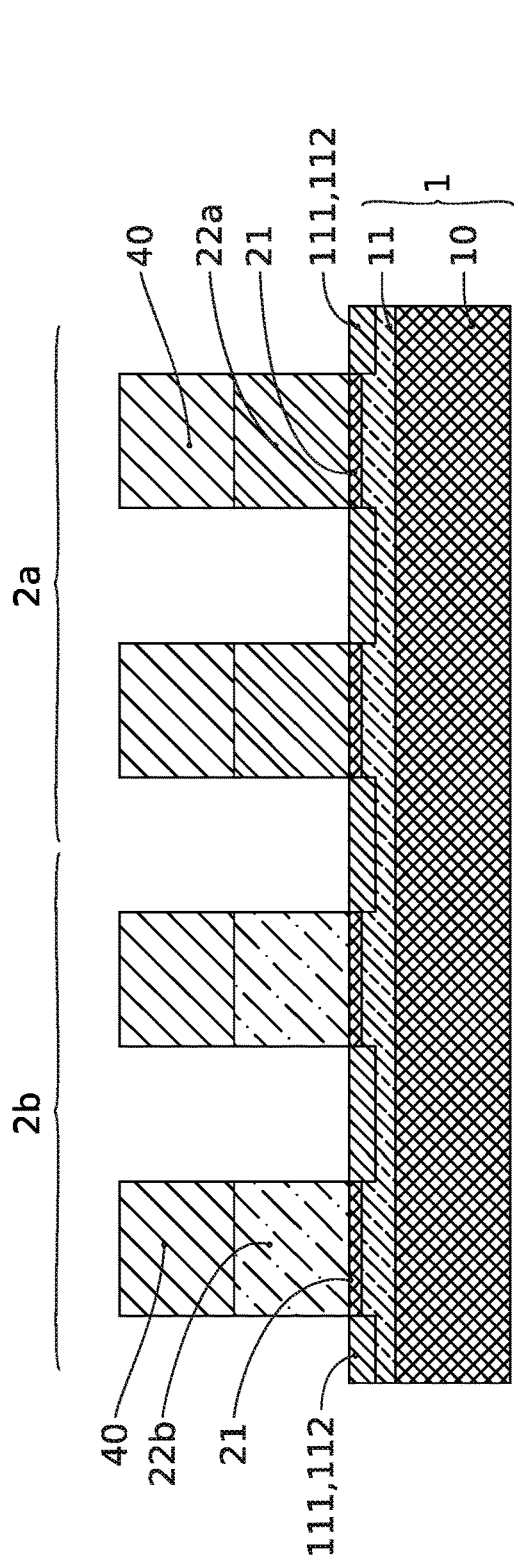

FIG. 8A to 8F show part of the method allowing for the co-integration of conventional FDSOI MOSFETs and superconducting gate quantum devices on the same substrate 1. This can be achieved by masking part of the transistor patterns 2 with a masking layer 70 prior to the formation 120 of the metal layer 50. This prevents the formation 130 of superconducting regions 22b in the gates 22a of the masked transistor patterns 2. According to one example, after the formation 110 of the protective layer 111, 112 (FIG. 8A), a masking layer 70 based on SiO2 or preferably SiN a few nanometres thick, for example 2 nm to 3 nm thick, is conformally deposited on all transistor patterns 2. In a conventional photolithography step, part of the transistor patterns 2 are masked by a resin 71 (FIG. 8B). The masking layer 70 is then removed from the unmasked transistor patterns 2, for example by wet etching using a HF solution or by isotropic plasma. The resin 71 is then removed, either by wet etching or by O2 plasma, to obtain a first set 2a of transistor patterns 2 with a masking layer 70, and a second set 2b of transistor patterns 2 without a masking layer 70 (FIG. 8C). The metal layer 50 can then be conformally deposited on the first and second sets 2a, 2b, as shown in FIG. 8D. The superconducting regions 22b are thus only formed 130 within the gates 22a of the second set 2b of transistor patterns 2, as shown in FIG. 8E. The masking layer 70 advantageously prevents lateral diffusion of the superconducting elements within the gates 22a of the first set 2a of transistor patterns 2. The gates 22a of the first set 2a of transistor patterns 2 are thus preserved. The masking layer 70 can then be removed, as shown in FIG. 8F. This removal can be carried out by wet etching with a phosphoric acid solution H3PO4 if the masking layer 70 is SiN-based. Such an etch in particular has good selectivity to the oxide 111, 112. Alternatively, isotropic plasma etching can be carried out to remove the masking layer 70. Alternatively, wet etching with a HF solution can be carried out if the masking layer 70 is SiO2-based.

FIG. 9A to 9D show part of the method allowing for the silicidation of the gates 22a of the conventional FDSOI MOSFETs co-integrated with superconducting gate quantum devices. The active layer 11 shown here is of constant thickness. The source and drain regions can be formed in this case directly in the active layer 11. This part of the method can also be implemented with raised source/drain regions, for example formed on an active layer 11 of non-constant thickness, as described and illustrated hereinabove. After the formation of the superconducting regions 22b in the transistor patterns 2 of the set 2b, the hard mask 40 is removed from the top of the gates 22a of the set 2a, and retained on the top of the superconducting gates 22b of the set 2b (FIG. 9A). A metal layer 51, for example a nickel- or titanium-based layer, can then be conformally deposited on the patterns of the sets 2a, 2b (FIG. 9B). Silicidation can thus be carried out, typically by thermal annealing, so as to partially or fully silicide the gates 22a, 23 of the set 2a (FIG. 9C). This silicidation does not affect the superconducting gates 22b of the set 2b, which are protected by the spacers 20 and the hard masks 40. This silicidation can also allow silicided portions 32 to be formed at the source and drain regions. After the removal of the hard masks 40, superconducting gate quantum devices 22b and non-superconducting silicided gate FDSOI MOSFETs 23 are co-integrated on a single substrate 1 (FIG. 9D).

The invention is not limited to the aforementioned embodiments, and includes all embodiments compliant with the general concept thereof.

The invention claimed is:

1. A method for producing a quantum device, comprising:
    providing a substrate having a front face and carrying a transistor pattern on the front face thereof, said transistor pattern comprising, in a stack:
        a gate dielectric on the front face of the substrate, and
        a gate on the gate dielectric, said gate having a top and sidewalls,
    forming a protective layer at the front face of the substrate, said protective layer being configured to prevent diffusion of at least one metal species in the substrate,
    forming a metal layer based on at least one metal species at least on the sidewalls of the gate, and
    forming a superconducting region in the gate by lateral diffusion of the at least one metal species from the sidewalls of said gate.

2. The method according to claim 1, wherein the transistor pattern provided further comprises a hard mask on the top of the gate, said hard mask being configured to prevent diffusion of at least one metal species in the gate from said top, such that the formation of the superconducting region only occurs by lateral diffusion from the sidewalls of the gate.

3. The method according to claim 1, wherein the formed metal layer comprises at least one metal species chosen from cobalt, platinum, and vanadium.

4. The method according to claim 1, wherein forming the metal layer further comprises forming the metal layer by conformal deposition of metal on the transistor pattern and on the protective layer on the front face of the substrate.

5. The method according to claim 1, wherein the gate has a width Lg and the formed metal layer has a thickness em ≥Lg/5.

6. The method according to claim 1, wherein lateral diffusion is performed by thermal annealing.

7. The method according to claim 1, wherein the protective layer formed at the front face of the substrate has a thickness greater than or equal to 2 nm when forming the superconducting region.

8. The method according to claim 1, wherein forming the protective layer further comprises:
    oxidizing, in a differentiated manner, the front face of the substrate and the sidewalls of the gate, such that a thickness ef of oxide formed at the sidewalls of the gate is strictly less than a thickness es of oxide formed at the front face of the substrate, such that ef≤k.es where k≤0.8 and preferably k≤0.5, and
    removing the oxide formed at the sidewalls of the gate, said removal being configured to retain at least some of the oxide formed at the front face of the substrate so as to form the protective layer.

9. The method according to claim 8, wherein the differentiated oxidation is performed using at least one plasma comprising oxygen-based species and hydrogen-based species.

10. The method according to claim 9, wherein the hydrogen-based species are chosen from dihydrogen H2, ammonia NH3, and boron hydride HBr.

11. The method according to claim 8, wherein the removal of the oxide formed at the sidewalls of the gate is carried out performed by wet etching.

12. The method according to claim 1, wherein the forming the protective layer further comprises:
    depositing an oxide on the front face of the substrate and on the sidewalls of the gate, and
    partially removing the oxide deposited so as to leave an oxide layer on the front face of the substrate, said oxide layer having a thickness greater than or equal to the thickness of the gate dielectric of the transistor pattern.

13. The method according to claim 12, wherein the sidewalls of the gate are exposed over at least 90% of the height thereof, after the deposited oxide has been removed.

14. The method according to claim 12, wherein the oxide is deposited by spinning.

15. The method according to claim 1, wherein the substrate carries a plurality of transistor patterns and wherein a subset of the plurality of transistor patterns is masked prior to the formation of the metal layer so as to prevent the formation of superconducting regions in the gates of the transistor patterns of said subset.

* * * * *